US 9,600,278 B1

(12) United States Patent
Langhammer

(10) Patent No.: US 9,600,278 B1
(45) Date of Patent: Mar. 21, 2017

(54) PROGRAMMABLE DEVICE USING FIXED AND CONFIGURABLE LOGIC TO IMPLEMENT RECURSIVE TREES

(71) Applicant: Altera Corporation, San Jose, CA (US)

(72) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 789 days.

(21) Appl. No.: 13/941,847

(22) Filed: Jul. 15, 2013

Related U.S. Application Data

(63) Continuation-in-part of application No. 13/187,801, filed on Jul. 21, 2011, now abandoned.

(60) Provisional application No. 61/483,924, filed on May 9, 2011.

(51) Int. Cl.
*G06F 7/483* (2006.01)
*G06F 9/30* (2006.01)

(52) U.S. Cl.
CPC ................................. *G06F 9/3001* (2013.01)

(58) Field of Classification Search
None
See application file for complete search history.

(56) References Cited

U.S. PATENT DOCUMENTS

| | | | |
|---|---|---|---|
| 3,473,160 A | 10/1969 | Wahlstrom | |
| 3,697,734 A | 10/1972 | Booth et al. | |
| 3,800,130 A | 3/1974 | Martinson et al. | |
| 4,156,927 A | 5/1979 | McElroy et al. | |
| 4,179,746 A | 12/1979 | Tubbs | |
| 4,212,076 A | 7/1980 | Conners | |
| 4,215,406 A | 7/1980 | Gomola et al. | |
| 4,215,407 A | 7/1980 | Gomola et al. | |
| 4,422,155 A | 12/1983 | Amir et al. | |
| 4,484,259 A | 11/1984 | Palmer et al. | |

(Continued)

FOREIGN PATENT DOCUMENTS

| | | |
|---|---|---|
| EP | 0 158 430 | 10/1985 |
| EP | 0 380 456 | 8/1990 |

(Continued)

OTHER PUBLICATIONS

Altera Corporation "*Statix II Device Handbook, Chapter 6—DSP Blocks in Stratix II Devices*," v1.1, Jul. 2004.

(Continued)

*Primary Examiner* — David H Malzahn

(57) ABSTRACT

A specialized processing block on a programmable integrated circuit device includes a first floating-point arithmetic operator stage, and a floating-point adder stage having at least one floating-point binary adder. Configurable interconnect within the specialized processing block routes signals into and out of each of the first floating-point arithmetic operator stage and the floating-point adder stage. The block has a plurality of block inputs, at least one block output, a direct-connect input for connection to a first other instance of the specialized processing block, and a direct-connect output for connection to a second other instance of the specialized processing block. A plurality of instances of the specialized processing block are together configurable as a binary or ternary recursive adder tree.

24 Claims, 16 Drawing Sheets

(56) References Cited

U.S. PATENT DOCUMENTS

| | | | |
|---|---|---|---|
| 4,521,907 A | 6/1985 | Amir et al. | |
| 4,575,812 A | 3/1986 | Kloker et al. | |
| 4,597,053 A | 6/1986 | Chamberlin | |
| 4,616,330 A | 10/1986 | Betz | |
| 4,623,961 A | 11/1986 | Mackiewicz | |
| 4,682,302 A | 7/1987 | Williams | |
| 4,718,057 A | 1/1988 | Venkitakrishnan et al. | |
| 4,727,508 A | 2/1988 | Williams | |
| 4,736,335 A | 4/1988 | Barban | |
| 4,754,421 A | 6/1988 | Bosshart | |
| 4,791,590 A | 12/1988 | Ku et al. | |
| 4,799,004 A | 1/1989 | Mori | |
| 4,823,260 A | 4/1989 | Imel et al. | |
| 4,823,295 A | 4/1989 | Mader | |
| 4,839,847 A | 6/1989 | Laprade | |
| 4,871,930 A | 10/1989 | Wong et al. | |
| 4,893,268 A | 1/1990 | Denman et al. | |
| 4,908,788 A | 3/1990 | Fujiyama | |
| 4,912,345 A | 3/1990 | Steele et al. | |
| 4,916,651 A * | 4/1990 | Gill | G06F 7/5443 708/507 |
| 4,918,637 A | 4/1990 | Morton | |
| 4,967,160 A | 10/1990 | Quievy et al. | |
| 4,982,354 A | 1/1991 | Takeuchi et al. | |
| 4,991,010 A | 2/1991 | Hailey et al. | |
| 4,994,997 A | 2/1991 | Martin et al. | |
| 4,999,803 A | 3/1991 | Turrini et al. | |
| 5,073,863 A | 12/1991 | Zhang | |
| 5,081,604 A | 1/1992 | Tanaka | |
| 5,122,685 A | 6/1992 | Chan et al. | |
| 5,128,559 A | 7/1992 | Steele | |
| 5,175,702 A | 12/1992 | Beraud et al. | |
| 5,204,828 A * | 4/1993 | Kohn | G06F 7/483 708/501 |
| 5,208,491 A | 5/1993 | Ebeling et al. | |
| RE34,363 E | 8/1993 | Freeman | |
| 5,267,187 A | 11/1993 | Hsieh et al. | |
| 5,296,759 A | 3/1994 | Sutherland et al. | |
| 5,338,983 A | 8/1994 | Agarwala | |
| 5,339,263 A | 8/1994 | White | |
| 5,349,250 A | 9/1994 | New | |
| 5,357,152 A | 10/1994 | Jennings, III et al. | |
| 5,371,422 A | 12/1994 | Patel et al. | |
| 5,373,461 A | 12/1994 | Bearden et al. | |
| 5,375,079 A | 12/1994 | Uramoto et al. | |
| 5,381,357 A | 1/1995 | Wedgwood et al. | |
| 5,404,324 A | 4/1995 | Colon-Bonet | |
| 5,424,589 A | 6/1995 | Dobbelaere et al. | |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | |
| 5,497,498 A | 3/1996 | Taylor | |
| 5,500,812 A | 3/1996 | Saishi et al. | |
| 5,500,828 A | 3/1996 | Doddington et al. | |
| 5,523,963 A | 6/1996 | Hsieh et al. | |
| 5,528,550 A | 6/1996 | Pawate et al. | |
| 5,537,601 A | 7/1996 | Kimura et al. | |
| 5,541,864 A | 7/1996 | Van Bavel et al. | |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,563,819 A | 10/1996 | Nelson | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,631,848 A | 5/1997 | Laczko et al. | |
| 5,631,859 A | 5/1997 | Markstein et al. | |
| 5,633,601 A | 5/1997 | Nagaraj | |
| 5,636,150 A | 6/1997 | Okamoto | |
| 5,636,368 A | 6/1997 | Harrison et al. | |
| 5,640,578 A | 6/1997 | Balmer et al. | |
| 5,644,519 A | 7/1997 | Yatim et al. | |
| 5,644,522 A | 7/1997 | Moyse et al. | |
| 5,646,545 A | 7/1997 | Trimberger et al. | |
| 5,646,875 A | 7/1997 | Taborn et al. | |
| 5,648,732 A | 7/1997 | Duncan | |
| 5,652,903 A | 7/1997 | Weng et al. | |
| 5,655,069 A | 8/1997 | Ogawara et al. | |
| 5,664,192 A | 9/1997 | Lloyd et al. | |
| 5,689,195 A | 11/1997 | Cliff et al. | |
| 5,696,708 A | 12/1997 | Leung | |
| 5,729,495 A | 3/1998 | Madurawe | |
| 5,740,404 A | 4/1998 | Baji | |
| 5,744,980 A | 4/1998 | McGowan et al. | |
| 5,744,991 A | 4/1998 | Jefferson et al. | |
| 5,754,459 A | 5/1998 | Telikepalli | |
| 5,761,483 A | 6/1998 | Trimberger | |
| 5,764,555 A | 6/1998 | McPherson et al. | |
| 5,768,613 A | 6/1998 | Asghar | |
| 5,771,186 A | 6/1998 | Kodali et al. | |
| 5,777,912 A | 7/1998 | Leung et al. | |
| 5,784,636 A | 7/1998 | Rupp | |
| 5,790,446 A | 8/1998 | Yu et al. | |
| 5,794,067 A | 8/1998 | Kadowaki | |
| 5,801,546 A | 9/1998 | Pierce et al. | |
| 5,805,477 A | 9/1998 | Perner | |
| 5,805,913 A | 9/1998 | Guttag et al. | |
| 5,808,926 A | 9/1998 | Gorshtein et al. | |
| 5,812,479 A | 9/1998 | Cliff et al. | |
| 5,812,562 A | 9/1998 | Baeg | |
| 5,815,422 A | 9/1998 | Dockser | |
| 5,821,776 A | 10/1998 | McGowan | |
| 5,825,202 A | 10/1998 | Tavana et al. | |
| 5,838,165 A | 11/1998 | Chatter | |
| 5,841,684 A | 11/1998 | Dockser | |
| 5,847,579 A | 12/1998 | Trimberger | |
| 5,847,978 A | 12/1998 | Ogura et al. | |
| 5,847,981 A | 12/1998 | Kelley et al. | |
| 5,859,878 A | 1/1999 | Phillips et al. | |
| 5,869,979 A | 2/1999 | Bocchino | |
| 5,872,380 A | 2/1999 | Rostoker et al. | |
| 5,874,834 A | 2/1999 | New | |
| 5,878,250 A | 3/1999 | LeBlanc | |
| 5,880,981 A | 3/1999 | Kojima et al. | |
| 5,892,962 A | 4/1999 | Cloutier | |
| 5,894,228 A | 4/1999 | Reddy et al. | |
| 5,898,602 A | 4/1999 | Rothman et al. | |
| 5,931,898 A | 8/1999 | Khoury | |
| 5,942,914 A | 8/1999 | Reddy et al. | |
| 5,944,774 A | 8/1999 | Dent | |
| 5,949,710 A | 9/1999 | Pass et al. | |
| 5,951,673 A | 9/1999 | Miyata | |
| 5,956,265 A | 9/1999 | Lewis | |
| 5,959,871 A | 9/1999 | Pierzchala et al. | |
| 5,960,193 A | 9/1999 | Guttag et al. | |
| 5,961,635 A | 10/1999 | Guttag et al. | |
| 5,963,048 A | 10/1999 | Harrison et al. | |
| 5,963,050 A | 10/1999 | Young et al. | |
| 5,968,196 A | 10/1999 | Ramamurthy et al. | |
| 5,970,254 A | 10/1999 | Cooke et al. | |
| 5,978,260 A | 11/1999 | Trimberger et al. | |
| 5,982,195 A | 11/1999 | Cliff et al. | |
| 5,986,465 A | 11/1999 | Mendel | |
| 5,991,788 A | 11/1999 | Mintzer | |
| 5,991,898 A | 11/1999 | Rajski et al. | |
| 5,995,748 A | 11/1999 | Guttag et al. | |
| 5,999,015 A | 12/1999 | Cliff et al. | |
| 5,999,990 A | 12/1999 | Sharrit et al. | |
| 6,005,806 A | 12/1999 | Madurawe et al. | |
| 6,006,321 A | 12/1999 | Abbott | |
| 6,009,451 A | 12/1999 | Burns | |

(56) References Cited

U.S. PATENT DOCUMENTS

| | | | |
|---|---|---|---|
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A | 3/2000 | Yu et al. |
| 6,041,340 A | 3/2000 | Mintzer |
| 6,052,327 A | 4/2000 | Reddy et al. |
| 6,052,755 A | 4/2000 | Terrill et al. |
| 6,052,773 A | 4/2000 | DeHon et al. |
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |
| 6,075,381 A | 6/2000 | LaBerge |
| 6,084,429 A | 7/2000 | Trimberger |
| 6,085,317 A | 7/2000 | Smith |
| 6,091,261 A | 7/2000 | DeLange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,108,772 A | 8/2000 | Sharangpani |
| 6,130,554 A | 10/2000 | Kolze et al. |
| 6,140,839 A | 10/2000 | Kaviani et al. |
| 6,144,980 A | 11/2000 | Oberman |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,230,180 B1 * | 5/2001 | Mohamed ........... G06F 9/30014 708/523 |
| 6,242,947 B1 | 6/2001 | Trimberger |
| 6,243,729 B1 | 6/2001 | Staszewski |
| 6,246,258 B1 | 6/2001 | Lesea |
| 6,260,053 B1 | 7/2001 | Maulik et al. |
| 6,279,021 B1 | 8/2001 | Takano et al. |
| 6,286,024 B1 | 9/2001 | Yano et al. |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,327,605 B2 | 12/2001 | Arakawa et al. |
| 6,346,824 B1 | 2/2002 | New |
| 6,351,142 B1 | 2/2002 | Abbott |
| 6,353,843 B1 | 3/2002 | Chehrazi et al. |
| 6,359,468 B1 | 3/2002 | Park et al. |
| 6,360,240 B1 | 3/2002 | Takano et al. |
| 6,362,650 B1 | 3/2002 | New et al. |
| 6,366,944 B1 | 4/2002 | Hossain et al. |
| 6,367,003 B1 | 4/2002 | Davis |
| 6,369,610 B1 | 4/2002 | Cheung et al. |
| 6,377,970 B1 | 4/2002 | Abdallah et al. |
| 6,407,576 B1 | 6/2002 | Ngai et al. |
| 6,407,694 B1 | 6/2002 | Cox et al. |
| 6,427,157 B1 | 7/2002 | Webb |
| 6,434,587 B1 | 8/2002 | Liao et al. |
| 6,438,569 B1 | 8/2002 | Abbott |
| 6,438,570 B1 | 8/2002 | Miller |
| 6,446,107 B1 | 9/2002 | Knowles |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,487,575 B1 | 11/2002 | Oberman |
| 6,523,055 B1 | 2/2003 | Yu et al. |
| 6,523,057 B1 | 2/2003 | Savo et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,564,238 B1 | 5/2003 | Kim et al. |
| 6,571,268 B1 | 5/2003 | Giacalone et al. |
| 6,573,749 B2 | 6/2003 | New et al. |
| 6,574,762 B1 | 6/2003 | Karimi et al. |
| 6,578,060 B2 | 6/2003 | Chen et al. |
| 6,591,283 B1 | 7/2003 | Conway et al. |
| 6,591,357 B2 | 7/2003 | Mirsky |
| 6,600,495 B1 | 7/2003 | Boland et al. |
| 6,600,788 B1 | 7/2003 | Dick et al. |
| 6,601,077 B1 * | 7/2003 | Aldrich .................. G06F 7/544 708/201 |
| 6,615,341 B2 * | 9/2003 | Sih ..................... G06F 9/30098 708/204 |
| 6,628,140 B2 | 9/2003 | Langhammer et al. |
| 6,687,722 B1 | 2/2004 | Larsson et al. |
| 6,692,534 B1 | 2/2004 | Wang et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,732,134 B1 | 5/2004 | Rosenberg |
| 6,744,278 B1 | 6/2004 | Liu et al. |
| 6,745,254 B2 | 6/2004 | Boggs et al. |
| 6,763,367 B2 | 7/2004 | Kwon et al. |
| 6,771,094 B1 | 8/2004 | Langhammer et al. |
| 6,774,669 B1 | 8/2004 | Liu et al. |
| 6,781,408 B1 | 8/2004 | Langhammer |
| 6,781,410 B2 | 8/2004 | Pani et al. |
| 6,788,104 B2 | 9/2004 | Singh et al. |
| 6,801,924 B1 | 10/2004 | Green et al. |
| 6,836,839 B2 | 12/2004 | Master et al. |
| 6,874,079 B2 | 3/2005 | Hogenauer |
| 6,889,238 B2 | 5/2005 | Johnson |
| 6,904,471 B2 | 6/2005 | Boggs et al. |
| 6,915,322 B2 | 7/2005 | Hong |
| 6,924,663 B2 | 8/2005 | Masui et al. |
| 6,963,890 B2 | 11/2005 | Dutta et al. |
| 6,971,083 B1 | 11/2005 | Farrugia et al. |
| 6,978,287 B1 | 12/2005 | Langhammer |
| 6,983,300 B2 | 1/2006 | Ferroussat |
| 7,020,673 B2 | 3/2006 | Ozawa |
| 7,024,446 B2 | 4/2006 | Langhammer et al. |
| 7,047,272 B2 | 5/2006 | Giacalone et al. |
| 7,062,526 B1 | 6/2006 | Hoyle |
| 7,093,204 B2 | 8/2006 | Oktem et al. |
| 7,107,305 B2 | 9/2006 | Deng et al. |
| 7,113,969 B1 | 9/2006 | Green et al. |
| 7,181,484 B2 | 2/2007 | Stribaek et al. |
| 7,230,451 B1 | 6/2007 | Langhammer |
| 7,313,585 B2 | 12/2007 | Winterrowd |
| 7,343,388 B1 | 3/2008 | Burney et al. |
| 7,395,298 B2 | 7/2008 | Debes et al. |
| 7,401,109 B2 | 7/2008 | Koc et al. |
| 7,409,417 B2 | 8/2008 | Lou |
| 7,415,542 B2 | 8/2008 | Hennedy et al. |
| 7,421,465 B1 | 9/2008 | Rarick et al. |
| 7,428,565 B2 | 9/2008 | Fujimori |
| 7,428,566 B2 | 9/2008 | Siu et al. |
| 7,430,578 B2 | 9/2008 | Debes et al. |
| 7,430,656 B2 | 9/2008 | Sperber et al. |
| 7,447,310 B2 | 11/2008 | Koc et al. |
| 7,472,155 B2 | 12/2008 | Simkins et al. |
| 7,508,936 B2 | 3/2009 | Eberle et al. |
| 7,536,430 B2 | 5/2009 | Guevokian et al. |
| 7,565,388 B1 * | 7/2009 | Baeckler ............ H03K 19/1733 708/235 |
| 7,567,997 B2 | 7/2009 | Simkins et al. |
| 7,590,676 B1 | 9/2009 | Langhammer |
| 7,646,430 B2 | 1/2010 | Brown Elliott et al. |
| 7,650,374 B1 | 1/2010 | Gura et al. |
| 7,668,896 B2 | 2/2010 | Lutz et al. |
| 7,719,446 B2 | 5/2010 | Rosenthal et al. |
| 7,720,898 B2 | 5/2010 | Driker et al. |

(56) References Cited

U.S. PATENT DOCUMENTS

| | | |
|---|---|---|
| 7,769,797 B2 | 8/2010 | Cho et al. |
| 7,814,136 B1 | 10/2010 | Verma et al. |
| 7,814,137 B1 | 10/2010 | Mauer |
| 7,822,799 B1 | 10/2010 | Langhammer et al. |
| 7,836,117 B1 | 11/2010 | Langhammer et al. |
| 7,865,541 B1 | 1/2011 | Langhammer |
| 7,917,567 B1 | 3/2011 | Mason et al. |
| 7,930,335 B2 | 4/2011 | Gura |
| 7,930,336 B2 | 4/2011 | Langhammer |
| 8,024,394 B2 | 9/2011 | Prokopenko |
| 8,090,758 B1 | 1/2012 | Shimanek et al. |
| 8,112,466 B2 | 2/2012 | Minz et al. |
| 8,332,452 B2 * | 12/2012 | Mejdrich ............... G06F 17/16 708/523 |
| 8,447,800 B2 | 5/2013 | Dockser et al. |
| 8,463,835 B1 | 6/2013 | Walke |
| 8,468,191 B2 | 6/2013 | Mantor et al. |
| 8,543,634 B1 * | 9/2013 | Xu ......................... G06F 7/552 326/41 |
| 8,595,279 B2 | 11/2013 | Dockser |
| 8,751,551 B2 | 6/2014 | Streicher et al. |
| 2001/0023425 A1 | 9/2001 | Oberman et al. |
| 2001/0029515 A1 | 10/2001 | Mirsky |
| 2001/0037352 A1 | 11/2001 | Hong |
| 2002/0002573 A1 * | 1/2002 | Landers .................... G06F 7/49 708/501 |
| 2002/0032713 A1 | 3/2002 | Jou et al. |
| 2002/0038324 A1 | 3/2002 | Page et al. |
| 2002/0049798 A1 | 4/2002 | Wang et al. |
| 2002/0078114 A1 | 6/2002 | Wang et al. |
| 2002/0089348 A1 | 7/2002 | Langhammer |
| 2002/0116434 A1 | 8/2002 | Nancekievill |
| 2002/0143841 A1 | 10/2002 | Farooqui et al. |
| 2002/0194240 A1 * | 12/2002 | Pangal .................. G06F 7/5443 708/501 |
| 2003/0065699 A1 | 4/2003 | Burns |
| 2003/0088757 A1 | 5/2003 | Lindner et al. |
| 2004/0064770 A1 | 4/2004 | Xin |
| 2004/0083412 A1 | 4/2004 | Corbin et al. |
| 2004/0103133 A1 | 5/2004 | Gurney |
| 2004/0122882 A1 | 6/2004 | Zakharov et al. |
| 2004/0148321 A1 | 7/2004 | Guevorkian et al. |
| 2004/0172439 A1 | 9/2004 | Lin |
| 2004/0178818 A1 | 9/2004 | Crotty et al. |
| 2004/0193981 A1 | 9/2004 | Clark et al. |
| 2004/0267857 A1 | 12/2004 | Abel et al. |
| 2004/0267863 A1 | 12/2004 | Bhushan et al. |
| 2005/0038842 A1 | 2/2005 | Stoye |
| 2005/0144212 A1 | 6/2005 | Simkins et al. |
| 2005/0144215 A1 | 6/2005 | Simkins et al. |
| 2005/0144216 A1 | 6/2005 | Simkins et al. |
| 2005/0166038 A1 | 7/2005 | Wang et al. |
| 2005/0187997 A1 | 8/2005 | Zheng et al. |
| 2005/0187999 A1 | 8/2005 | Zheng et al. |
| 2005/0262175 A1 | 11/2005 | Iino et al. |
| 2006/0020655 A1 | 1/2006 | Lin |
| 2006/0112160 A1 | 5/2006 | Ishii et al. |
| 2007/0083585 A1 | 4/2007 | St. Denis et al. |
| 2007/0185951 A1 | 8/2007 | Lee et al. |
| 2007/0185952 A1 | 8/2007 | Langhammer et al. |
| 2007/0241773 A1 | 10/2007 | Hutchings et al. |
| 2008/0133627 A1 | 6/2008 | Langhammer et al. |
| 2008/0159441 A1 | 7/2008 | Liao et al. |
| 2008/0183783 A1 | 7/2008 | Tubbs |
| 2009/0083358 A1 | 3/2009 | Allen |
| 2009/0113186 A1 | 4/2009 | Kato et al. |
| 2009/0172052 A1 | 7/2009 | DeLaquil et al. |
| 2009/0182795 A1 | 7/2009 | Dobbek et al. |
| 2009/0187615 A1 | 7/2009 | Abe et al. |
| 2009/0228689 A1 | 9/2009 | Muff et al. |
| 2009/0292750 A1 | 11/2009 | Reyzin et al. |
| 2009/0300088 A1 | 12/2009 | Michaels et al. |
| 2009/0300323 A1 | 12/2009 | Hessel et al. |
| 2010/0098189 A1 | 4/2010 | Oketani |
| 2010/0146022 A1 | 6/2010 | Swartzlander et al. |
| 2010/0191939 A1 | 7/2010 | Muff et al. |
| 2011/0106868 A1 | 5/2011 | Lutz |
| 2011/0137970 A1 | 6/2011 | Dockser et al. |
| 2012/0166512 A1 | 6/2012 | Wong et al. |
| 2013/0138711 A1 | 5/2013 | Sugisawa |
| 2014/0067895 A1 | 3/2014 | Wang |
| 2014/0089371 A1 | 3/2014 | De Dinechin et al. |

FOREIGN PATENT DOCUMENTS

| | | |
|---|---|---|
| EP | 0 411 491 | 2/1991 |
| EP | 0 419 105 | 3/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 721 159 | 7/1996 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 63-216131 | 8/1988 |
| JP | 4-332036 | 11/1992 |
| JP | 5-134851 | 6/1993 |
| JP | 06-187129 | 7/1994 |
| JP | 7-135447 | 5/1995 |
| JP | 11-296345 | 10/1999 |
| JP | 2000-259394 | 9/2000 |
| JP | 2002-108606 | 4/2002 |
| JP | 2002-251281 | 9/2002 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO 2005/066832 | 7/2005 |
| WO | WO 2005/101190 | 10/2005 |

OTHER PUBLICATIONS

Altera Corporation, "Digital Signal Processing (DSP)," *Stratix Device Handbook*, vol. 2, Chapter 6 and Chapter 7, v1.1 (Sep. 2004).

Altera Corporation, "DSP Blocks in Stratix II and Stratix II GX Devices," *Stratix II Device Handbook*, vol. 2, Chapter 6, v4.0 (Oct. 2005).

Altera Corporation, "FIR Compiler: MegaCore® Function User Guide," version 3.3.0, rev. 1, pp. 3-11 through 3-15 (Oct. 2005).

Altera Corporation, "Advanced Synthesis Cookbook: A Design Guide for Stratix II, Stratix III and Stratix IV Devices," Document Version 3.0, 112 pgs., May 2008.

Amos, D., "PLD architectures match DSP algorithms," Electronic Product Design, vol. 17, No. 7, Jul. 1996, pp. 30, 32.

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs," *Field-Programmable Logic and Applications. Roadmap to Reconfigurable*

(56) References Cited

OTHER PUBLICATIONS

Computing. *10th International Conference, FPL 2000. Proceedings (Lecture Notes in Computer Science* vol. 1896) Aug. 27-30, 2000, pp. 456-461.

Aoki, T., "Signed-weight arithmetic and its application to a field-programmable digital filter architecture," *IEICE Transactions on Electronics*, 1999, vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg, B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings—Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

deDinechin, F. et al., "Large multipliers with less DSP blocks," retrieved from http://hal-ens-lyon.archives-ouvertes.fr/ensl-00356421/en/, 9 pgs., available online Jan. 2009.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL'98. Proceedings*, Hartenstein, R.W., et al., eds., Aug. 31-Sep. 3, 1998, pp. 441-445.

Faura et al., "A Novel Mixed Signal Programmable Device With On-Chip Microprocessor," Custom Integrated Circuits Conference, 1997. *Proceedings of the IEEE 1997* Santa Clara, CA, USA, May 5, 1997, pp. 103-106.

Fujioka, Y., et al., "240MOPS Reconfigurable Parallel VLSI Processor for Robot Control," *Proceedings of the 1992 International Conference on Industrial Electronics, Control, Instrumentation, and Automation: Signal Processing and Systems Control; Intelligent Sensors and Instrumentation*, vol. 3, pp. 1385-1390, Nov. 9-13, 1992.

Gaffar, A.A., et al., "Floating-Point Bitwidth Analysis via Automatic Differentiation," *IEEE Conference on Field Programmable Technology*, Hong Kong, Dec. 2002.

Govindu, G. et al., "A Library of Parameterizable Floating-Point Cores for FPGAs and Their Application to Scientific Computing," *Proc Int'l Conf. Eng. Reconfigurable Systems and Algorithms (ERSA'05)* Jun. 2005.

Govindu, G. et al., "Analysis of High-performance Floating-point Arithmetic on FPGAs," *Proceedings of the 18th International Parallel and Distributed Processing Symposium (PDPS'04)*, pp. 149-156, Apr. 2004.

Guccione, S.A.,"Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http:--www.ee.washington.edu-people-faculty-hauck-publications-ReconfigFuture.PDF.

Haynes, S.D., et al., "Configurable multiplier blocks for embedding in FPGAs," *Electronicas Letters*, vol. 34, No. 7, pp. 638-639 (Apr. 2, 1998).

Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

"Implementing Multipliers in FLEX 10K EABs", *Altera*, Mar. 1996.

"Implementing Logic with the Embedded Array in FLEX 10K Devices", *Altera*, May 2001, ver. 2.1.

Jones, G., "Field-programmable digital signal conditioning," *Electronic Product Design*, vol. 21, No. 6, Jun. 2000, pp. C36-C38.

Karlström, P., et al., "High Performance, Low Latency FPGA based Floating Point Adder and Multiplier Units in a Virtex 4," Norchip Conf., pp. 31-34, 2006.

Kiefer, R., et al., "Performance comparison of software-FPGA hardware partitions for a DSP application," *14th Australian Microelectronics Conference. Microelectronics: Technology Today for the Future. MICRO '97 Proceedings*, Sep. 28-Oct. 1, 1997, pp. 88-93.

Kim, Y., et al., "Fast GPU Implementation for the Solution of Tridiagonal Matrix Systems," *Journal of Korean Institute of Information Scientists and Engineers*, vol. 32, No. 12, pp. 692-704, Dec. 2005.

Kramberger, I., "DSP acceleration using a reconfigurable FPGA," *ISIE '99. Proceedings of the IEEE International Symposium on Industrial Electronics* (Cat. No. 99TH8465) vol. 3, Jul. 12-16, 1999, pp. 1522-1525.

Langhammer, M., "How to implement DSP in programmable logic," *Elettronica Oggi*, No. 266, Dec. 1998, pp. 113-115.

Langhammer, M., "Implementing a DSP in Programmable Logic," *Online EE Times*, May 1998, http://www.eetimes.com/editorial/1998/coverstory9805.html.

Lattice Semiconductor Corp, *ORCA® FPGA Express™ Interface Manual: ispLEVER® Version 3.0*, 20 pgs, 2002.

Lazaravich, B.V., "Function block oriented field programmable logic arrays," *Motorola, Inc. Technical Developments*, vol. 18, Mar. 1993, pp. 10-11.

Jinghua Li, "Design a pocket multi-bit multiplier in FPGA," *1996 2nd International Conference on ASIC Proceedings (IEEE* Cat. No. 96TH8140), Oct. 21-24, 1996, pp. 275-279.

Lucent Technologies, Microelectronics Group,"Implementing and Optimizing Multipliers in ORCA™ FPGAs," Application Note. AP97 008FGPA, pp. 1-11, Feb. 1997.

Lund, D., et al., "A new development system for reconfigurable digital signal processing," *First International Conference on 3G Mobile Communication Technologies* (Conf. Publ. No. 471), Mar. 27-29, 2000, pp. 306-310.

Martinson, L. et al., "Digital Matched Filtering with Pipelined Floating Point Fast Fourier Transforms (FFT's)," *IEEE Transactions on Acoustics, Speech, and Signal Processing*, vol. ASSP 23, No. 2, pp. 222 34, Apr. 1975.

Miller, N.L., et al., "Reconfigurable integrated circuit for high performance computer arithmetic," *Proceedings of the 1998 IEE Colloquium on Evolvable Hardware Systems (Digest)*, No. 233, 1998, pp. 2-1-2-4.

Mintzer, L., "Xilinx FPGA as an FFT processor," *Electronic Engineering*, vol. 69, No. 845, May 1997, pp. 81, 82, 84.

Nakasato, N., et al., "Acceleration of Hydrosynamical Simulations using a FPGA board", *The Institute of Electronics Information and Communication Technical Report CPSY2005-47*, vol. 105, No. 515, Jan. 17, 2006.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9), vol. 3, Oct. 28-Nov. 1, 1991, pp. 2014-2018.

(56) References Cited

OTHER PUBLICATIONS

Osana, Y., et al., "Hardware-resource Utilization Analysis on an FPGA-Based Biochemical Simulator ReCSiP", *The Institute of Electronics Information and Communication Technical Report CPSY2005-63*, vol. 105, No. 516, Jan. 18, 2006.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", *Quicklogic*, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)* vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Texas Instruments Inc., "TMS320C54x DSP Reference Set, vol. 1: CPU and Peripherals", *Literature* No. SPRU131F, Apr. 1999, pp. 2-1 through 2-16 and 4-1 through 4-29.

Thapliyal, H., et al., "Combined Integer and Floating Point Multiplication Architecture (CIFM) for FPGSs and Its Reversible Logic Implementation", *Proceedings MWSCAS 2006*, Puerto Rico, 5 pages, Aug. 2006.

Thapliyal, H., et al., "Combined Integer and Variable Precision (CIVP) Floating Point Multiplication Architecture for FPGAs", *Proceedings of the 2007 International Conference on Parallel and Distributed Processing Techniques and Applications (PDPTA'07)*, Las Vegas, US, vol. 1, pp. 449-450, Jun. 2007.

Tisserand, A., et al., "An on-line arithmetic based FPGA for low power custom computing," *Field Programmable Logic and Applications, 9th International Workshop, FPL'99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Underwood, K. "FPGAs vs. CPUs: Trends in Peak Floating-Point Performance," *Proceedings of the 2004 ACM-SIGDA 12th International Symposium on Field Programmable Gate Arrays*, pp. 171-180, Feb. 22-24, 2004.

Valls, J., et al., "A Study About FPGA-Based Digital Filters," *Signal Processing Systems*, 1998 SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Vladimirova, T. et al., "Floating-Point Mathematical Co-Processor for a Single-Chip On-Board Computer," *MAPLD'03 Conference, D5*, Sep. 2003.

Wajih, E.-H.Y. et al., "Efficient Hardware Architecture of Recursive Karatsuba-Ofman Multiplier," *3rd International Conference on Design and Technology of Integrated Systems in Nanoscale Era*, 6 pgs., Mar. 2008.

Walters, A.L., "A Scaleable FIR Filter Implementation Using 32-bit Floating-Point Complex Arithmetic on a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication," MathWorld—A Wolfram Web Resource (Dec. 9, 2007), accessed Dec. 11, 2007 at http://mathworld.wolfram.com/KaratsubaMultiplication.html.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http:--www.iro.umontreal.ca-~aboulham-F6221-Xilinx%20A%201D%20systolic%20FIR.htm.

Xilinx, Inc., "The Future of FPGA's," White Paper, available Nov. 14, 2005 for download from http:--www.xilinx.com-prs_rls,5yrwhite.htm.

Xilinx Inc., "XtremeDSP Design Considerations User Guide," v 1.2, pp. 1-114, Feb. 4, 2005.

Xilinx Inc., "Complex Multiplier v2.0", DS291 Product Specification/Datasheet, Nov. 2004.

Xilinx, Inc., "Implementing Barrel Shifters Using Multipliers", p. 1-4, Aug. 17, 2004.

Xilinx, Inc., Virtex-5 ExtremeDSP Design Considerations User Guide UG193, v2.6, 114 pages, Oct. 2007.

Zhou, G. et al., "Efficient and High-Throughput Implementations of AES-GCM on FPGAs," International Conference on Field-Programmable Technology, 8 pgs., Dec. 2007.

* cited by examiner

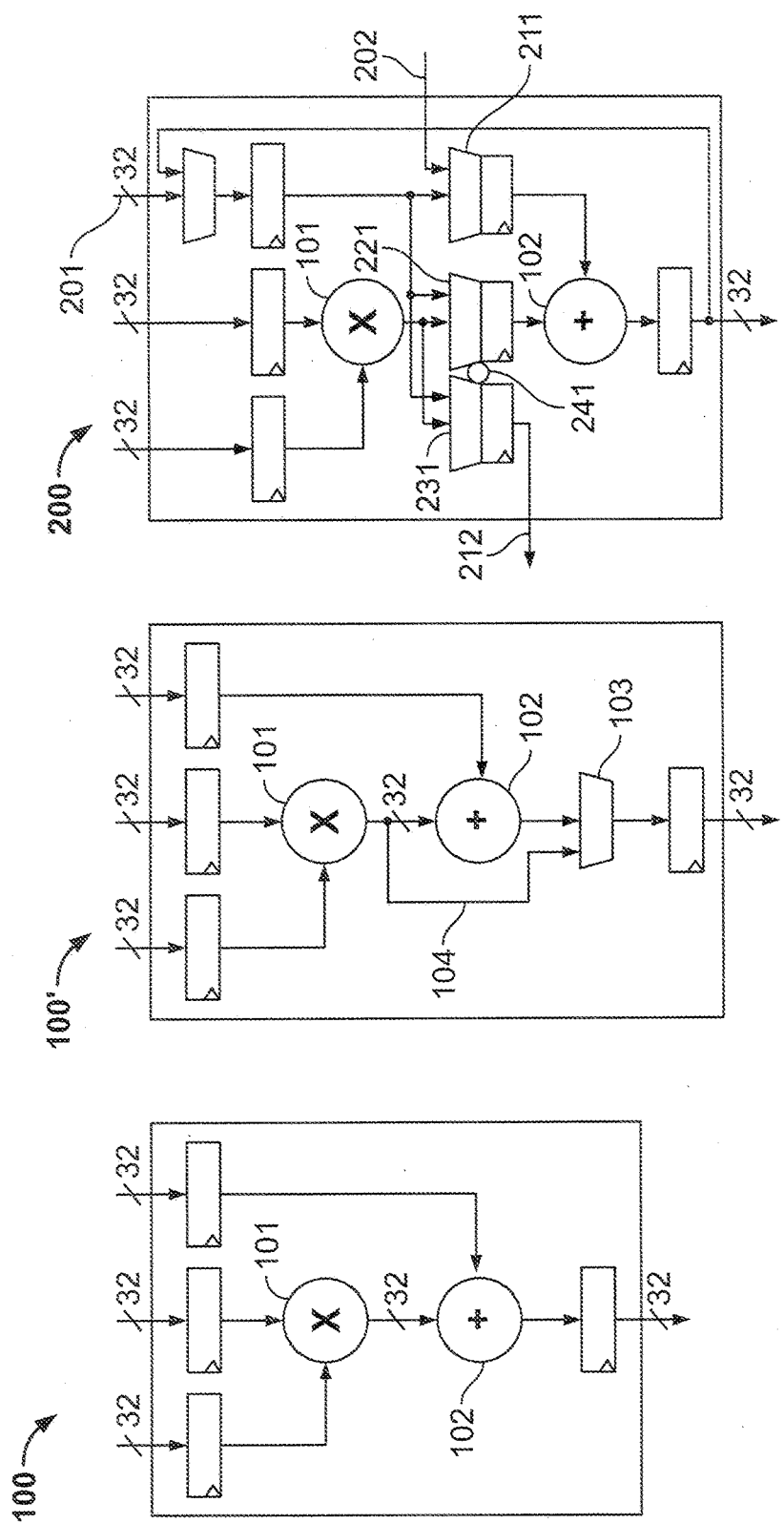

PROGRAMMABLE DEVICE USING FIXED AND CONFIGURABLE LOGIC TO IMPLEMENT RECURSIVE TREES

CROSS REFERENCE TO RELATED APPLICATION

This is a continuation-in-part of commonly-assigned U.S. patent application Ser. No. 13/187,801, filed Jul. 21, 2011, now abandoned, and claims the benefit of, commonly-assigned U.S. Provisional Patent Application No. 61/483,924, filed May 9, 2011, each of which is hereby incorporated by reference herein in its respective entirety.

FIELD OF THE INVENTION

This invention relates to a programmable integrated circuit device, and particularly to a specialized processing block in a programmable integrated circuit device.

BACKGROUND OF THE INVENTION

Considering a programmable logic device (PLD) as one example of an integrated circuit device, as applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, PLDs sold by Altera Corporation, of San Jose, Calif., as part of the STRATIX® and ARRIA® families include DSP blocks, each of which includes a plurality of multipliers. Each of those DSP blocks also includes adders and registers, as well as programmable connectors (e.g., multiplexers) that allow the various components of the block to be configured in different ways.

Typically, the arithmetic operators (adders and multipliers) in such specialized processing blocks have been fixed-point operators. If floating-point operators were needed, the user would construct them outside the specialized processing block using general-purpose programmable logic of the device, or using a combination of the fixed-point operators inside the specialized processing block with additional logic in the general-purpose programmable logic.

SUMMARY OF THE INVENTION

In accordance with embodiments of the present invention, specialized processing blocks such as the DSP blocks described above may be enhanced by including floating-point addition among the functions available in the DSP block. This reduces the need to construct floating-point functions outside the specialized processing block. The addition function may be a wholly or partially dedicated (i.e., "hard logic") implementation of addition in accordance with the IEEE754-1985 standard, and can be used for addition operations, multiply-add (MADD) operations, or vector (dot product) operations, any of which can be either real or complex. The floating-point adder circuit may be incorporated into the DSP Block, and can be independently accessed, or used in combination with a multiplier in the DSP block, or even multipliers in adjacent DSP blocks.

A plurality of such floating-point adder circuits may be configured as a binary or ternary recursive adder tree.

Therefore, in accordance with embodiments of the present invention there is provided a specialized processing block on a programmable integrated circuit device. The specialized processing block includes a first floating-point arithmetic operator stage, and a floating-point adder stage having at least one floating-point binary adder. Configurable interconnect within the specialized processing block routes signals into and out of each of the first floating-point arithmetic operator stage and the floating-point adder stage. The block has a plurality of block inputs, at least one block output, a direct-connect input for connection to a first other instance of the specialized processing block, and a direct-connect output for connection to a second other instance of the specialized processing block. A plurality of instances of the specialized processing block are together configurable as a recursive adder tree. There is also provided a programmable integrated circuit device comprising a plurality of such specialized processing blocks, as well as a method of configuring a binary or ternary adder tree on such a programmable integrated circuit device.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which:

FIG. 1 shows a logical diagram of an exemplary specialized processing block incorporating an embodiment of the present invention;

FIG. 1A shows a logical diagram of an exemplary specialized processing block incorporating an embodiment of the present invention;

FIG. 2 shows a more detailed diagram of an exemplary specialized processing block according to an embodiment of the present invention;

DETAILED DESCRIPTION OF THE INVENTION

Figure 3:
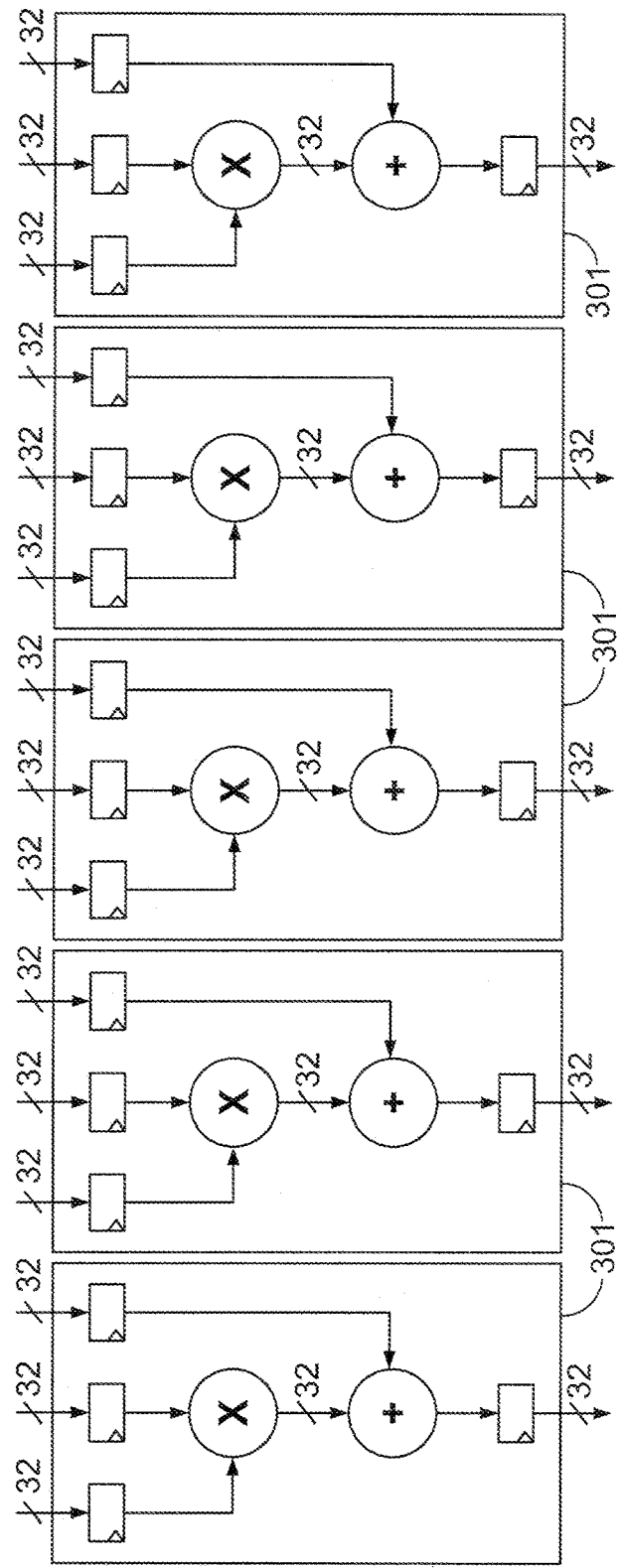
FIG. 3 shows a simplified block diagram of number of exemplary specialized processing blocks according to an embodiment of the present invention, in an exemplary arrangement according to an embodiment of the present invention.

FIG. 1 shows a logical diagram of an exemplary DSP block 100 according to an embodiment of the invention. In this logical representation, implementational details, such as registers and some programmable routing features—such as multiplexers that may allow the output of a particular structure to be routed directly out of block 100—are omitted to simplify discussion. In addition, some elements that are shown may, in an actual embodiment, be implemented more than once. For example, the multiplier 101 may actually represent two or more multipliers, as in the DSP blocks of the aforementioned STRATIX® and ARRIA® families of PLDs.

In the logical representation of FIG. 1, the floating-point adder 102 follows a floating-point multiplier 101. The floating-point multiplier may be constructed from a 27×27 fixed-point multiplier supported by the DSP block provided in STRATIX® V or ARRIA® V programmable devices from Altera Corporation, and some additional logic. The additional logic calculates exponents, as well as special and error conditions such as NAN (not-a-number), Zero and Infinity. Optionally, other logic may be provided to round the result of the multiplier to IEEE754 format. Such rounding can be implemented as part of the final adder within the multiplier structure (not shown), or in programmable logic outside the DSP block 100 when the output of the multiplier 101 is outputted directly from the DSP block 100.

The floating point multiplier 101 can feed the floating point adder 102 directly in a multiplier-add (MADD) mode, as depicted in FIG. 1. Alternatively, as depicted in FIG. 1A, the multiplier 101 output can be routed around the adder 102 directly to the output of the DSP block, with a multiplexer 103 provided to select between the output of the multiplier 101 or the output of the adder 102. Although the bypass 104 and multiplexer 103 are omitted from the other drawings to avoid cluttering those drawings, they should be considered to be present in all of the multiplier/adder DSP blocks shown, including that of FIG. 1.

FIG. 2 shows a more detailed diagram of an exemplary DSP block 200 according to an embodiment of this invention. Optionally bypassable pipelining (not shown) may be provided between the floating-point multiplier 101 and the floating-point adder 102. Optionally bypassable pipelining (not shown) can also be provided within either or both of the floating-point multiplier 101 and the floating-point adder 102. Inputs can be routed to the adder 102 from multiple sources, including an output of the multiplier 101, one of the inputs 201 to the DSP block 200, or a direct connection 202 from an adjacent similar DSP block 200.

In addition, the output of multiplier 101 and/or one of the inputs 201 to the DSP block 200, can also be routed via a direct connection 212 to the adder in an adjacent similar DSP block 200 (it being apparent that, except at the ends of a chain of blocks 200, each direct connection 202 receives its input from a direct connection 212, and that each direct connection 212 provides its output to a direct connection 202). Specifically, multiplexer 211 may be provided to select either input 201 or direct connection 202 as one input to adder 102. Similarly, multiplexer 221 may be provided to select either input 201 or the output of multiplier 101 as another input to adder 102. A third multiplexer 231 may be provided to select either input 201 or the output of multiplier 101 as the output to direct connection 212. Thus the inputs to adder 102 can be either sinput 201 and the output of multiplier 101, or input 201 and direct connection 202, and direct connection 212 can output either input 201 or the output of multiplier 101.

In one embodiment, multiplexer 221 and multiplexer 231, which have the same two inputs (input 201 and the output of multiplier 101), share a control signal, but in the opposite sense as indicated at 241, so that if one of the two multiplexers selects one of those two inputs, the other of the two multiplexers selects the other of those two inputs.

Multiple DSP blocks according to embodiments of the invention may be arranged in a row or column, so that information can be fed from one block to the next using the aforementioned direct connections 202/212, to create more complex structures. FIG. 3 shows a number of exemplary DSP blocks 301 according to an embodiment of the invention, arranged in a row 300 (without showing connections 202/212).

Figure 4:
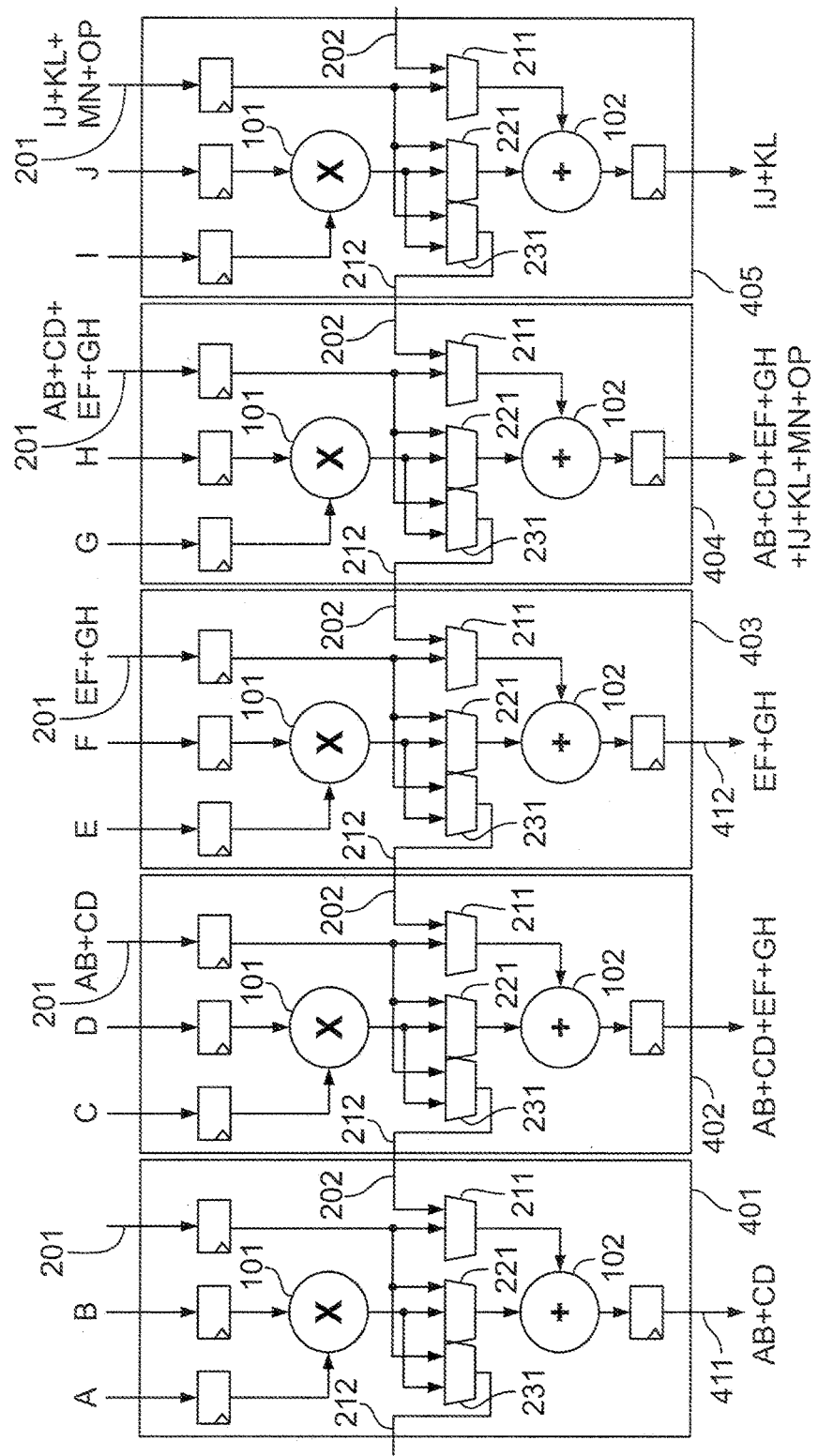
FIG. 4 shows an exemplary arrangement of exemplary specialized processing blocks according to an embodiment of the invention configured to perform a dot product.

FIG. 4 shows a row 400 of five exemplary DSP blocks 401-405 according to an embodiment of the invention configured to perform a dot product operation. Alternatively, the DSP blocks 401 in that configuration could be arranged in a column (not shown) without changing the inputs and outputs. The drawing shows the interface signals. In each pair of blocks 401/402 and 403/404, the multiplier 101 in each block, along with the adder 102 in the leftmost block 401, 403 of the two blocks, implement a respective sum 411, 412 of two multiplication operations. Those sums 411, 412 are summed with the rightmost adder of the leftmost pair— i.e., adder 102 of DSP block 402—using multiplexer 211 to select input 202 and using multiplexer 221 to select input 201 (to which the respective output 411/412 has been routed, e.g., using programmable interconnect resources of the PLD outside the blocks 401-404)—to provide a sum of four multiplies. The rightmost adder of the rightmost pair—i.e., adder 102 of DSP block 404 is used to add this sum of four multiplies to the sum of four multiplies from another set of four DSP blocks beginning with DSP block 405 (remainder not shown). For N multipliers there will be N adders, which is sufficient to implement the adder tree of a dot product, which, for a pair of vectors of length N, is the sum of N multiplication operations.

The same DSP block features can be used to implement a complex dot product. Each second pair of DSP blocks would use a subtraction rather than an addition in the first level addition, which can be supported by the floating-point adder (e.g., by negating one of the inputs, in a straightforward manner). The rest of the adder tree is a straightforward sum construction, similar to that described in the preceding paragraph.

Figure 5:
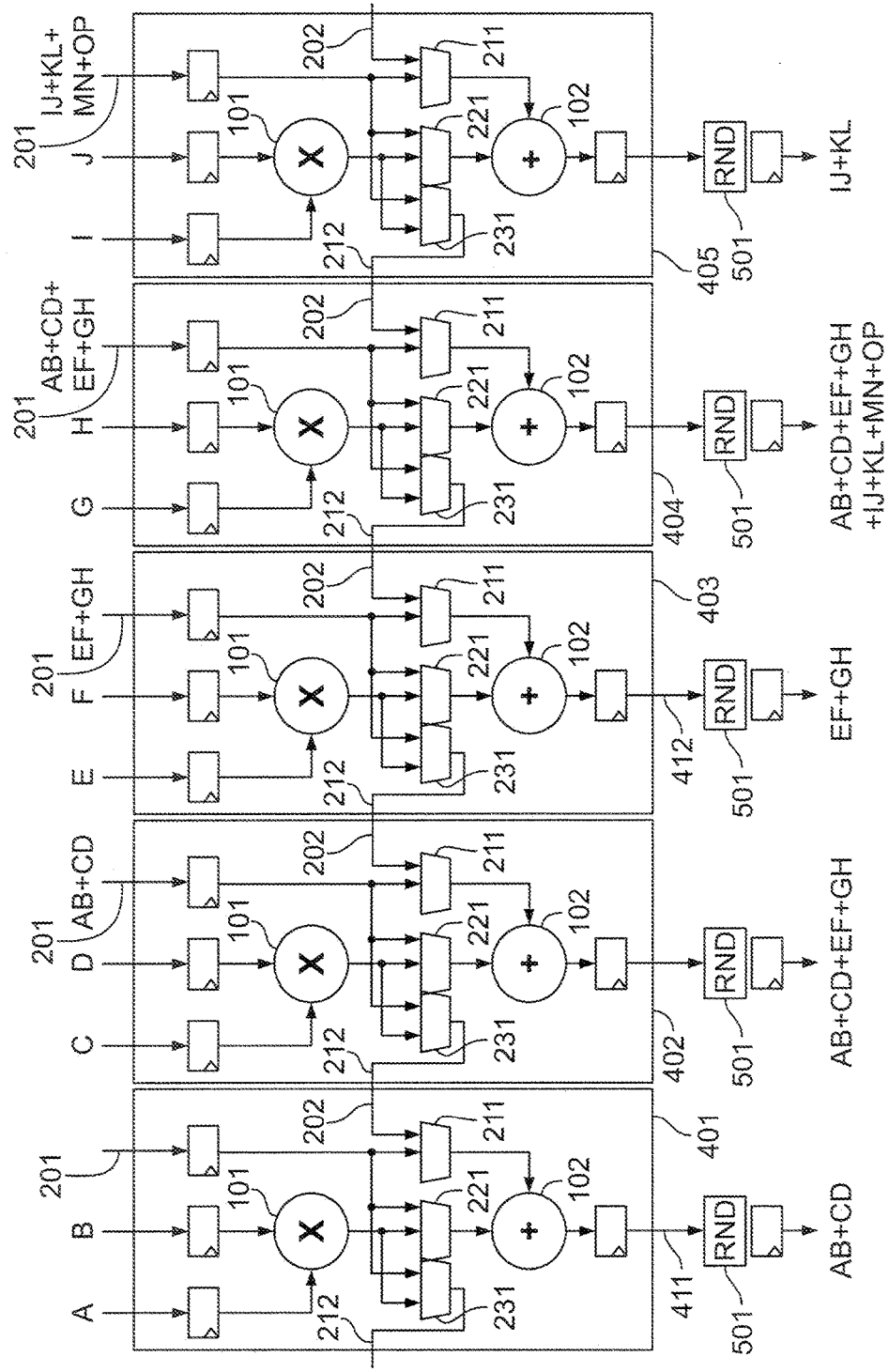
FIG. 5 shows an exemplary arrangement of exemplary specialized processing blocks similar to FIG. 4 with rounding implemented outside the blocks.

As discussed above, IEEE754-compliant rounding can be provided inside embodiments of the DSP block, or can be implemented in the general-purpose programmable logic portion of the device. Alternatively, rounding can be performed partly in the DSP block and partly in the general-purpose programmable logic. FIG. 5 shows as an example the arrangement of FIG. 4 with rounding implemented at 501 outside the block—i.e., in the general-purpose programmable logic portion of the device. The rounding can be implemented with a single level of logic, which may be as simple as a carry-propagate adder, followed by a register. Assuming, as is frequently the case, that all of the outputs of the DSP blocks must be rounded, there would be no disturbance or rebalancing of the datapath required.

Another feature that could be implemented in dedicated logic is the calculation of an overflow condition of the rounded value, which can be determined using substantially fewer resources than the addition. Additional features could calculate the value of a final exponent, or special or error conditions based on the overflow condition.

Figure 6:
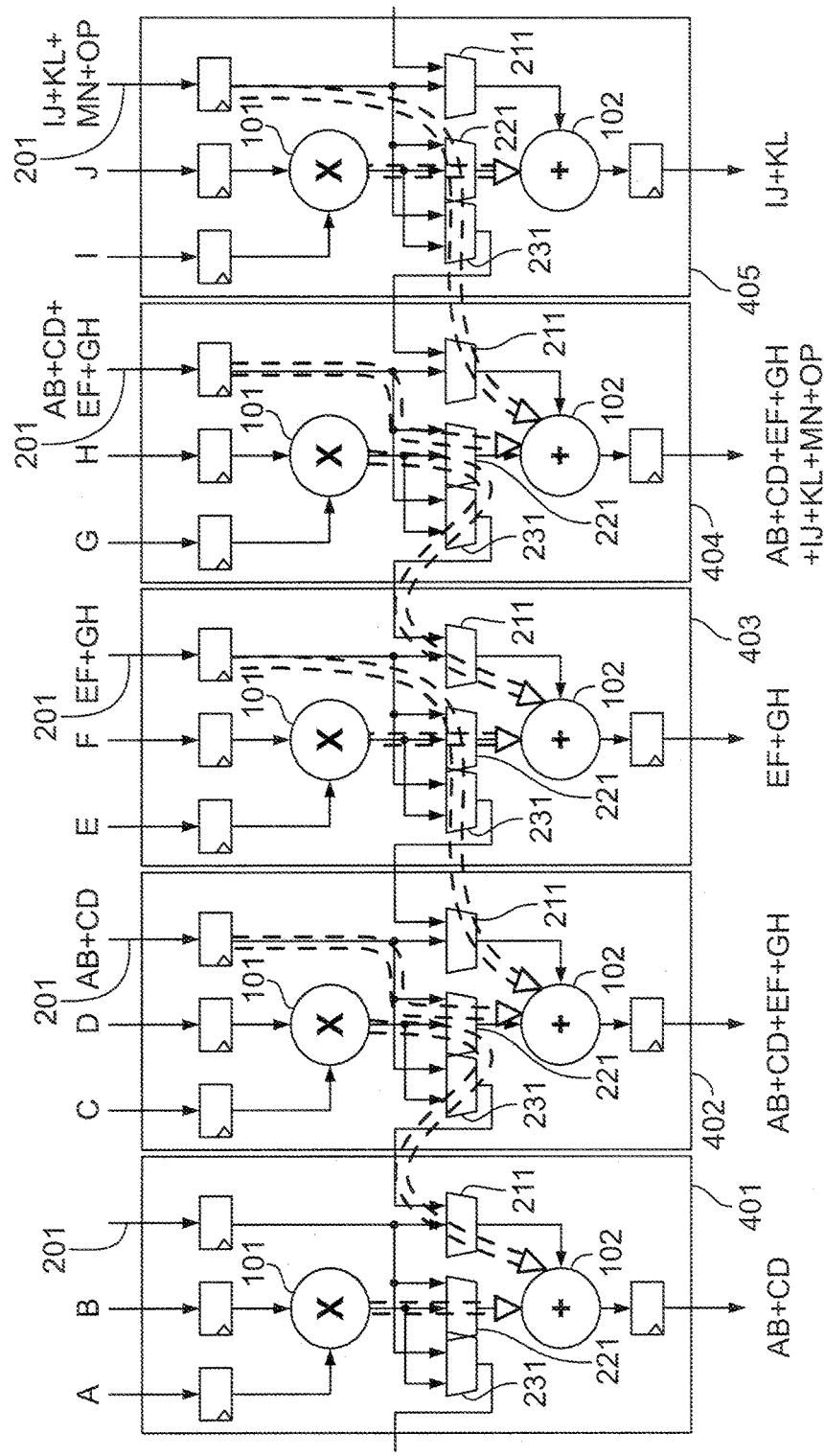
FIG. 6 shows an exemplary selection of datapaths when the exemplary arrangement of FIG. 4 is used to implement a vector dot product operation.

For the illustrated method of adder tree implementation, each DSP block output other than the output of the last block is fed back to the input of another DSP block. In some cases the output is fed back to an input of the same block, such as the EF+GH output 412 in FIG. 4. As seen in FIG. 2, an internal bus 250 may be provided to feed the output register of a block back to an input register, saving routing and interconnect resources in the general-purpose programmable logic portion of the device. FIG. 6 shows in phantom an exemplary selection of datapaths by multiplexers 211, 221, 231 for the dot product application example described earlier in connection with FIG. 4, showing how adder 102 of each block 401-405 adds a product of the multiplier 101 in that block and a product from an adjacent block.

Figure 7:
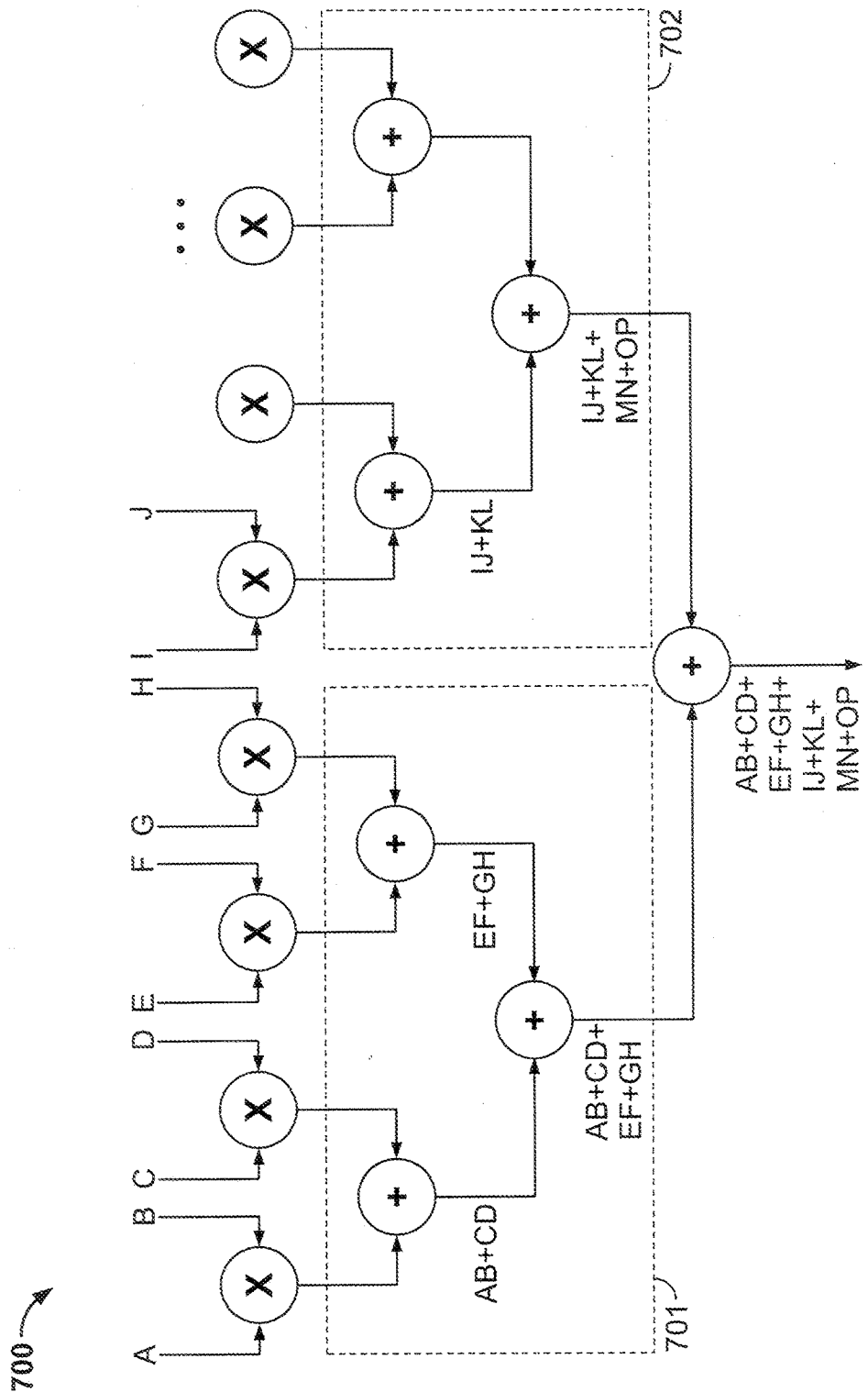
FIG. 7 shows a classic binary recursive adder tree of a type which may be implemented using embodiments of the present invention.

The result is a classic binary recursive adder tree of the type illustrated in FIG. 7. In such an adder tree 700 (not including the multipliers), each level has half the number of inputs as the previous level, and for N inputs at the first level, the depth—i.e., the total number of levels—is ceil($\log_2 N$). Thus, in FIG. 7, each subtree 701, 702 has four inputs and two levels (ceil($\log_2(4)$)=2), while overall adder tree 700 has eight inputs and three levels (ceil($\log_2(8)$)=3). As indicated by the labels in FIG. 6, the result of subtree 701 is output from block 402 and fed back to one of inputs 201 of block 404. The result of subtree 702 is output from the unseen block to the right of block 405 and fed back to one of inputs 201 of block 405, from which it is output via direct-connect output of block 405 to direct-connect input 202 of block 404, so that the result of tree 700 is output by block 404. While there is a 1:1 ratio of multipliers to adders in block 404, usually only N−1 adders will be needed for binary recursive adder tree 700.

Figure 8:
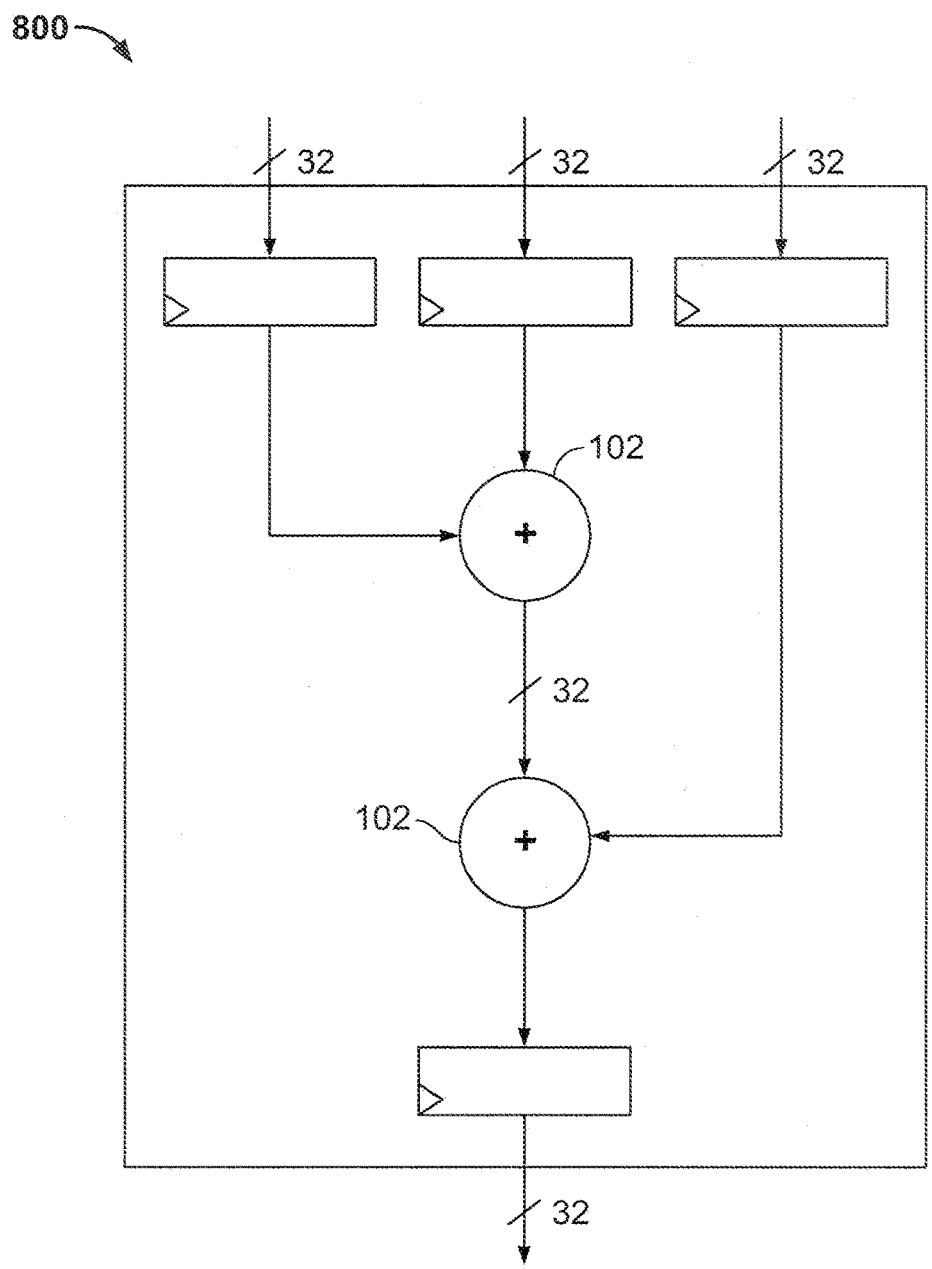
FIG. 8 shows an exemplary dedicated floating point adder block according to an embodiment of the present invention.

Another embodiment of a dedicated floating-point processing block is a dedicated floating-point adder block. Such a block can be binary (2-input operands) or ternary (3-input operands). FIG. 8 shows a logical block diagram of an exemplary ternary adder block 800, in which two binary adders 102 form a single ternary adder. As with the previously described DSP block, pipelining may or may not be used internally, and rounding may be supported either internally or externally in programmable logic. Also as with the DSP block, the adder blocks can be arranged in rows, as shown in the example in FIG. 9, or columns. Alternatively, adder blocks can be interleaved (not shown) with the multiplier-adder DSP blocks described above.

Figure 9:
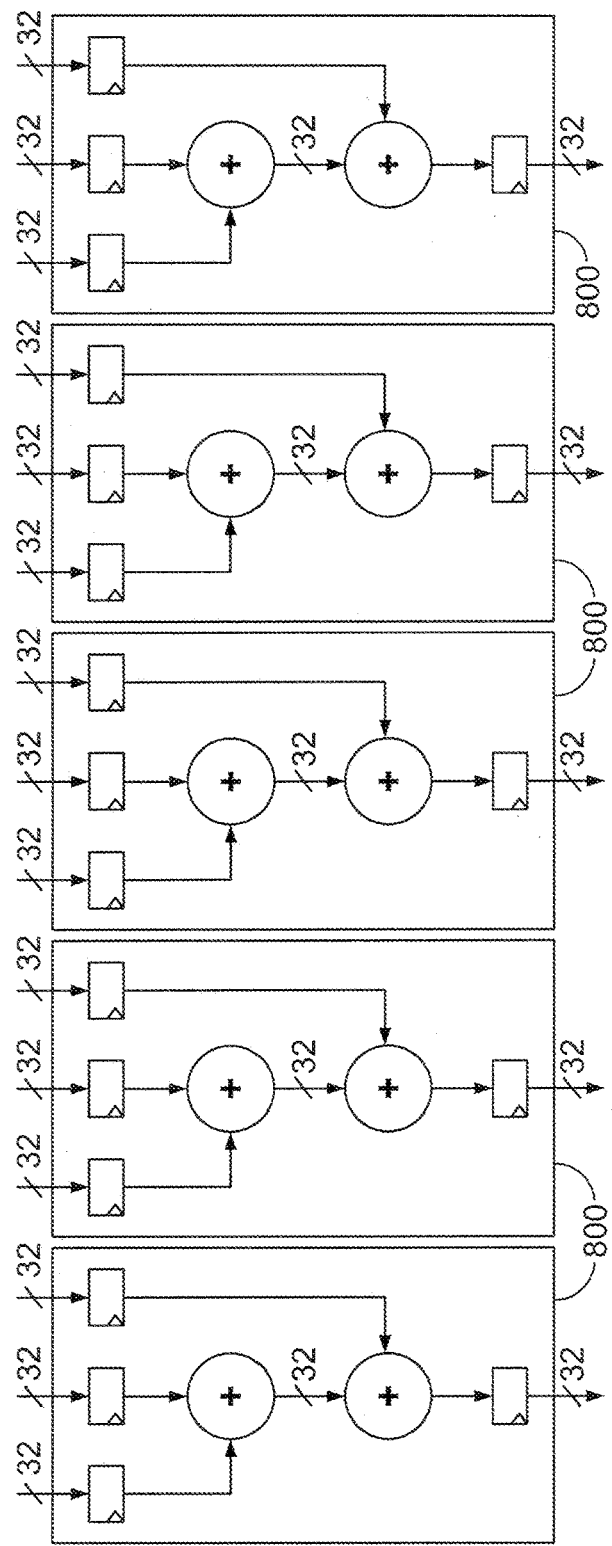
FIG. 9 shows an exemplary arrangement according to an embodiment of the invention, of a plurality of exemplary dedicated floating point adder blocks of FIG. 8.
Figure 10:
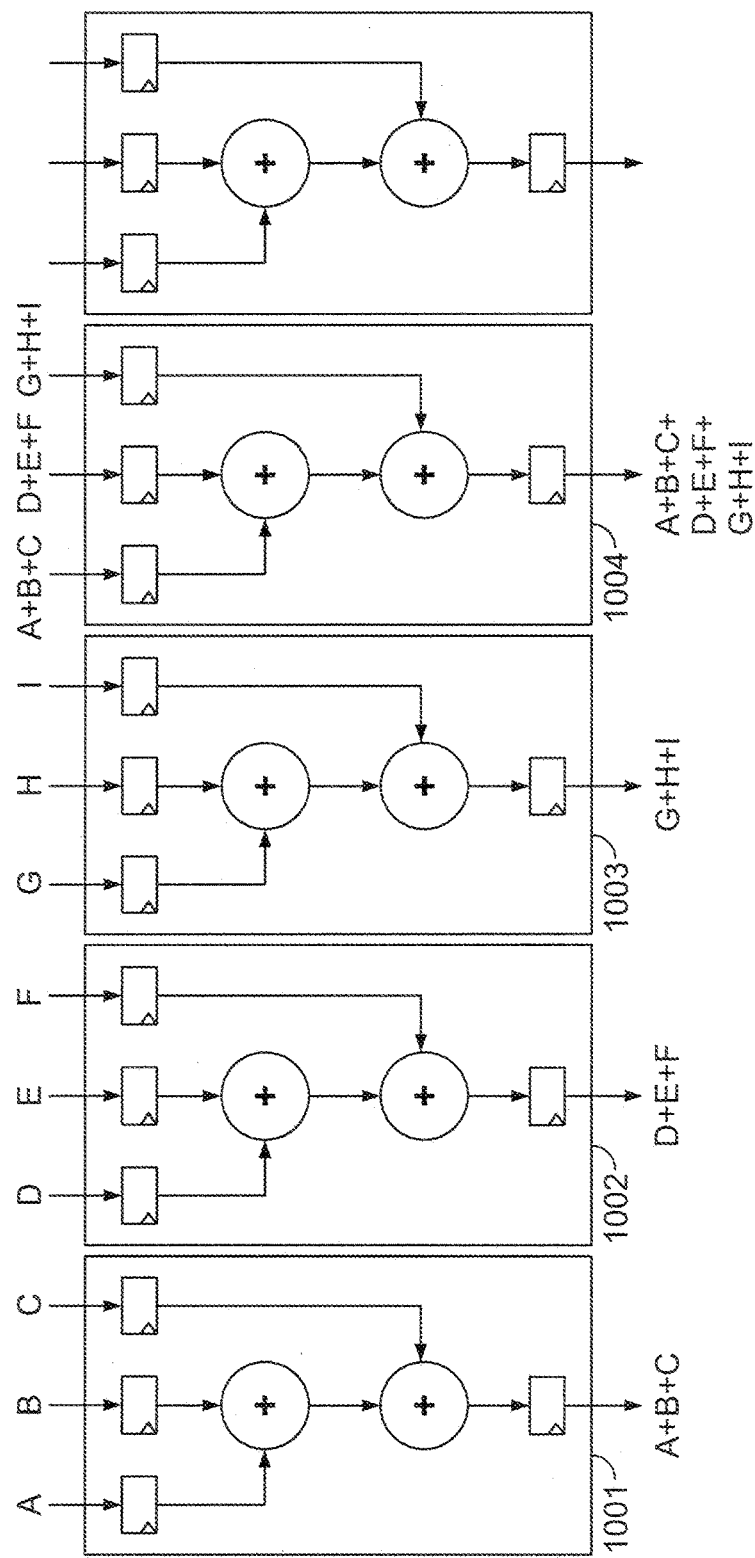
FIG. 10 shows an exemplary use of the arrangement of FIG. 9 as a ternary adder tree.
Figure 11:
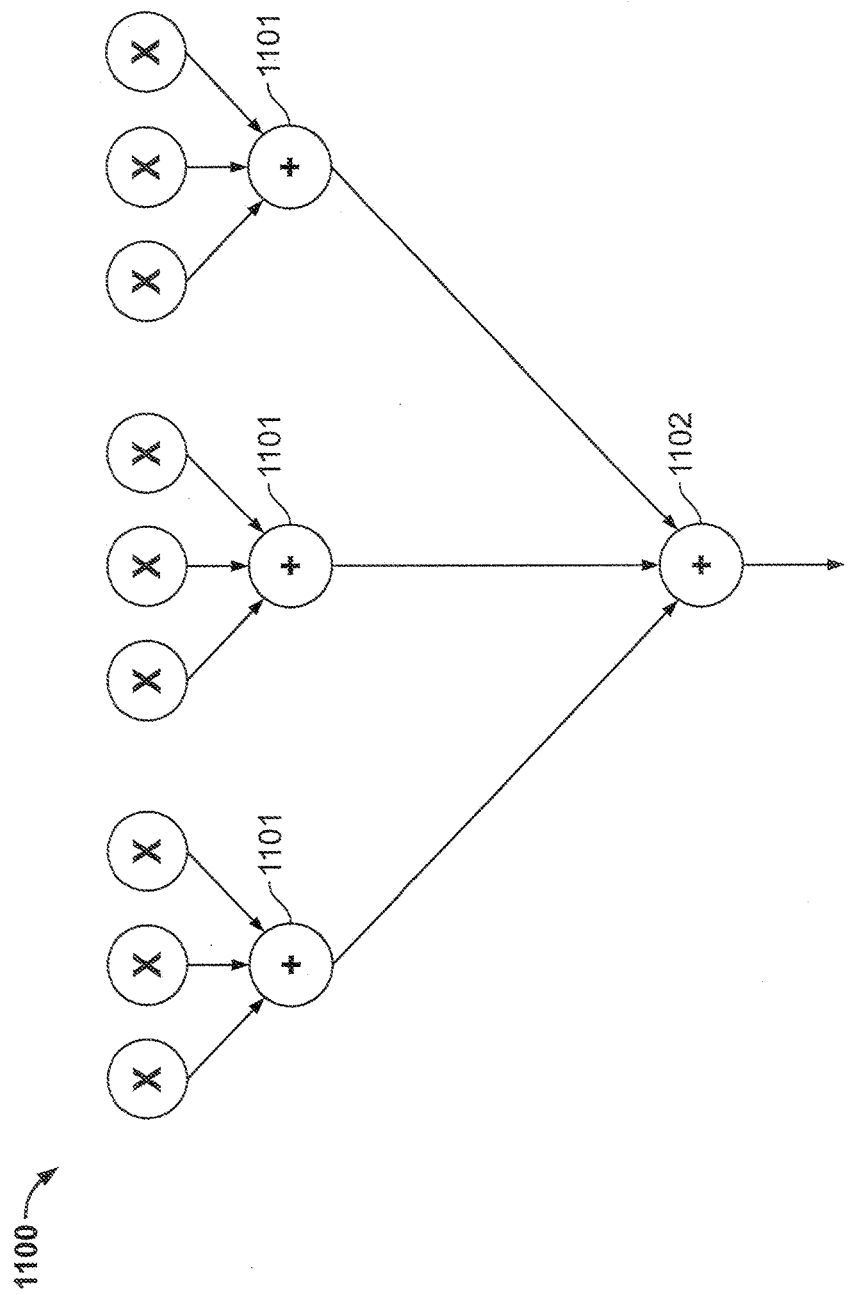
FIG. 11 shows a classic ternary recursive adder tree of a type which may be implemented using embodiments of the present invention.

FIG. 10 shows, using labels, exemplary connections used with blocks 800 arranged as in FIG. 9 to make a ternary floating-point adder tree of the type 1100 shown in FIG. 11. The ternary adder tree has a depth of ceil(log 3N), which is approximately one-half to two-thirds that of a binary adder. Considering the adders only, tree 1100 has nine inputs and a depth of 2 (three adders 1101 in one level, and adder 1102 in a second level). In the example of FIG. 10, again N=9, and four blocks are arranged in two levels (depth=$\log_3(9)$=2), with blocks 1001, 1002 and 1003 forming the first level (three ternary adders) and block 1004 forming the second level (one ternary adder). As discussed above in connection with FIGS. 4 and 5, rounding can be provided either inside or outside the blocks, or partly inside and partly outside the blocks. (not shown).

Figure 12:
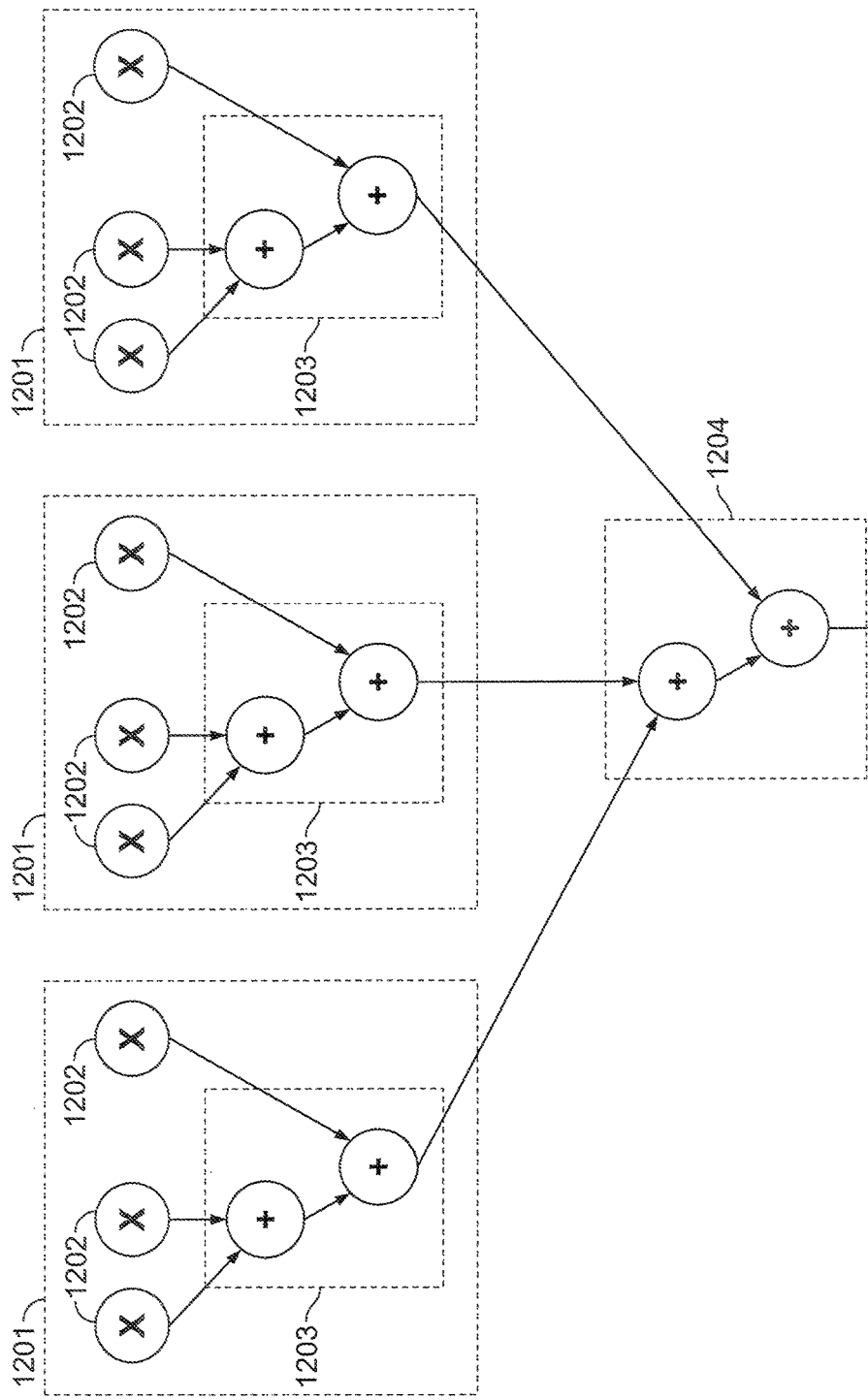
FIG. 12 shows a logical representation of an exemplary arrangement according to an embodiment of the invention, of a plurality of specialized processing blocks forming an example of a ternary recursive adder tree.

Although adder blocks 800 can be ternary, adders 102 within each block 800 are binary operators as noted above. Similarly, multiplier 101 and adder 102 of each DSP block 200 are binary operators. However, by using the direct connections 202/212, ternary trees can be constructed from those binary operators. FIG. 12 shows a logical representation of one example of such a tree 1200. Each logical block 1201 in the first level may be constructed from three DSP blocks 200 using direct connections 202/212. The two leftmost multipliers 101 of block 1201 are added using the adder in the leftmost block 200 using a 202/212 connection to route the output of multiplier 101 of the middle block 200 to the adder 102 in the leftmost block 200. The output of the leftmost block 200 is fed back to the input 201 of the middle block 200, feeding one input of the adder 102 of the middle block 200. The other input to the adder 102 of middle block 200 is the output of the multiplier 101 in the rightmost block 200, routed from the rightmost block to the middle block using a 202/212 connection. The two adders 102 (one each from the leftmost and middle blocks 200) are thereby cascaded to form a ternary adder 1203. Some additional pipelining (not shown) before or after the multiplier 101 in the rightmost block 200 may be required to align all of the adder inputs and outputs. This pipelining may be implemented inside the block 200, or implemented using delay registers (not shown) in the general purpose programmable logic before the multiplier 101 in the rightmost block 200. Ternary adder 1204 on the next level of ternary adder tree 1200 can be implemented, for example, using the two binary adders 102 of an adder block 800.

Figure 13:
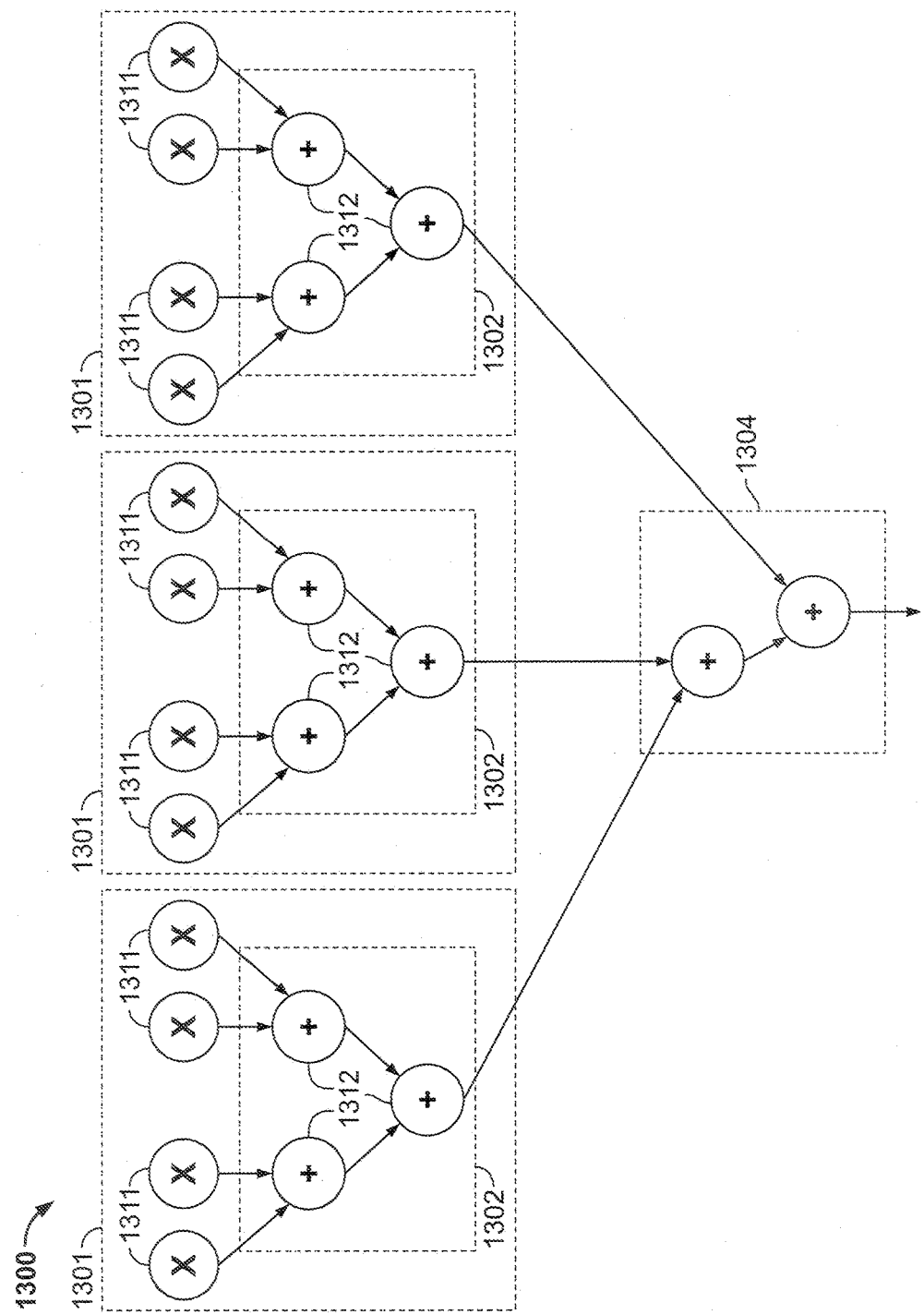
FIG. 13 shows a logical representation of an exemplary arrangement according to an embodiment of the invention, of a plurality of specialized processing blocks forming an example of a ternary recursive adder tree with quaternary operators.
Figure 14:
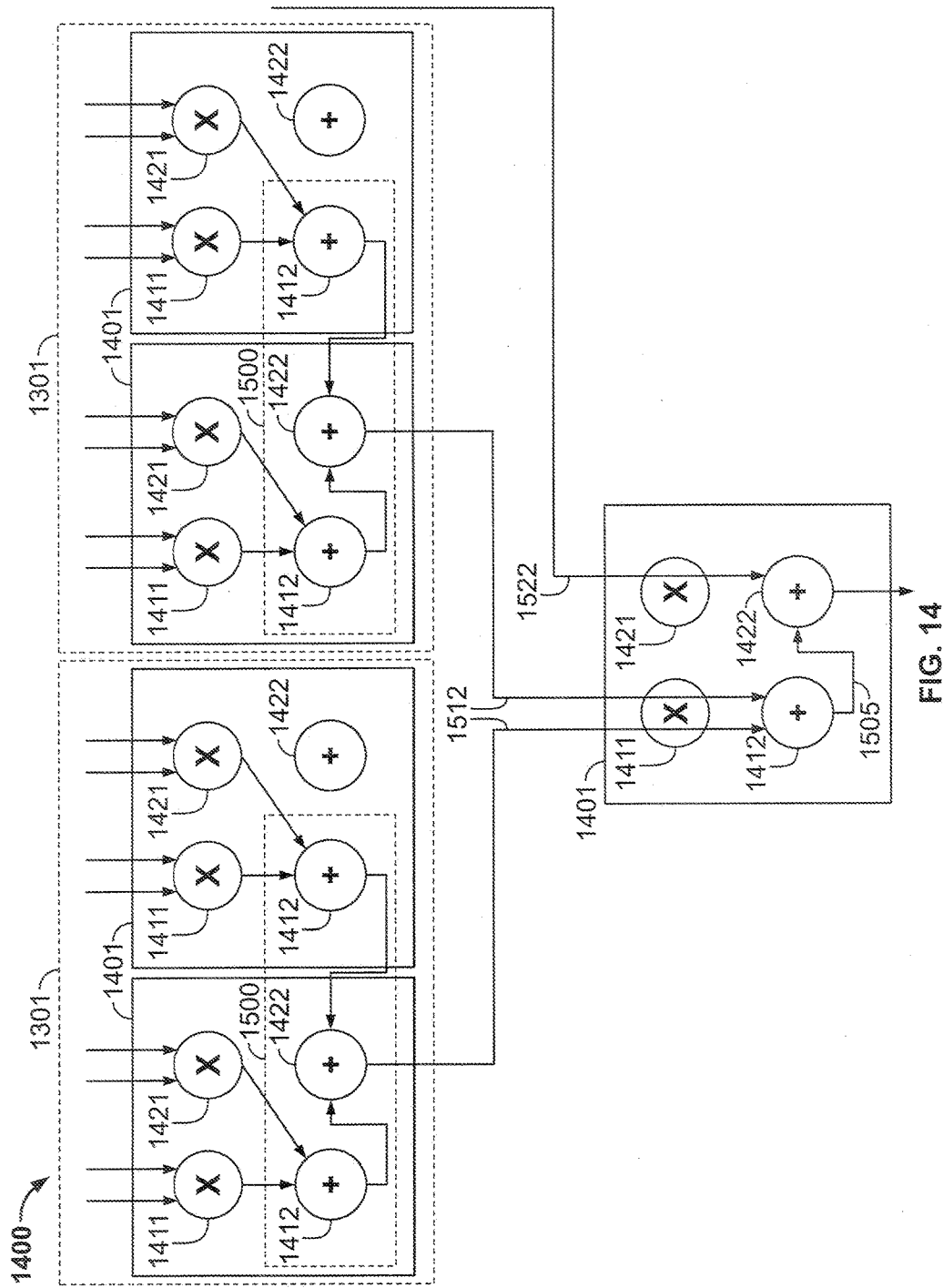
FIG. 14 shows an arrangement of exemplary specialized processing blocks forming the logical arrangement of FIG. 13.
Figure 15:
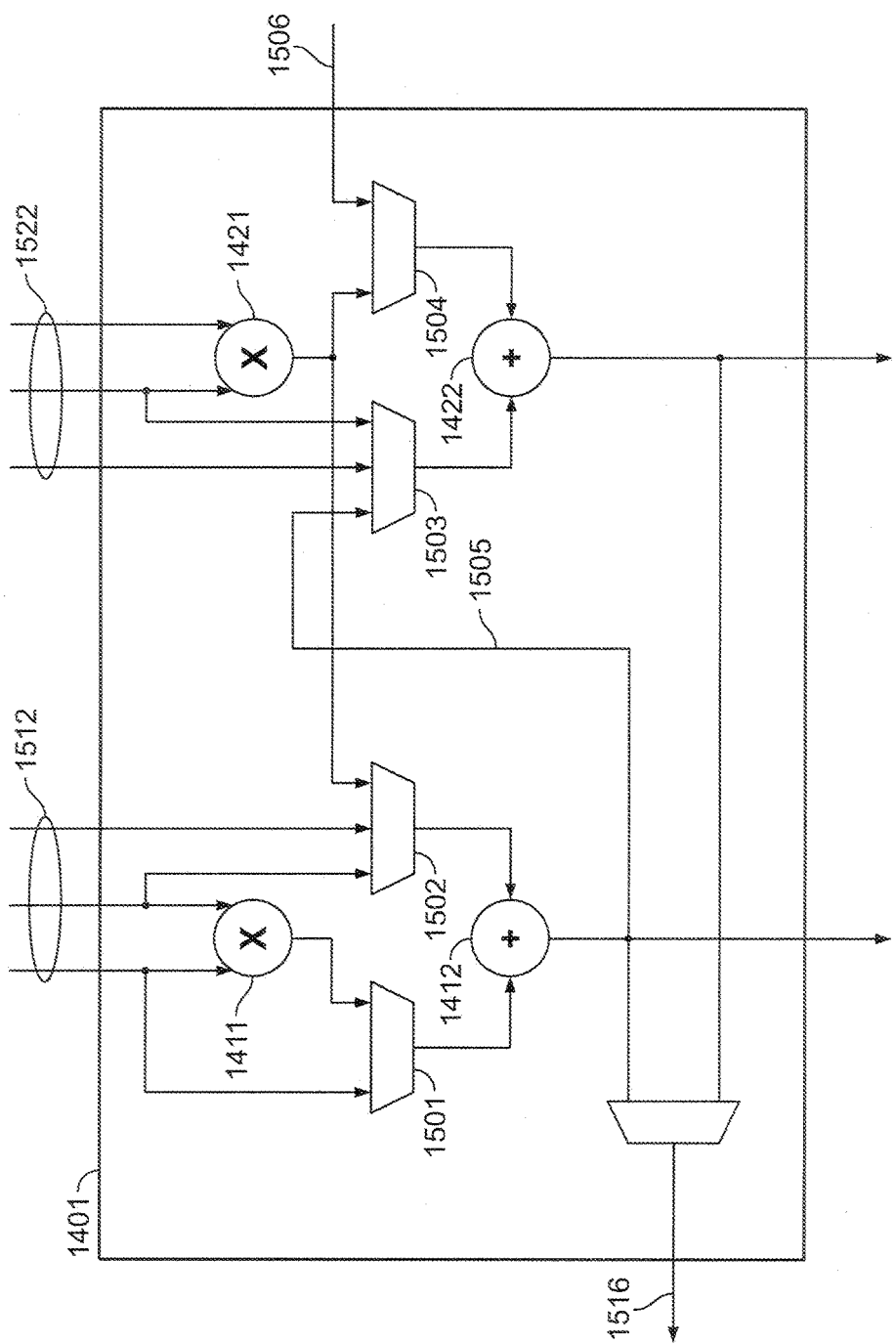
FIG. 15 shows an exemplary specialized processing block according to embodiments of the invention.

FIGS. 13-15 show how binary operators can be combined to form quaternary operators, with a combination of binary and quaternary operators then being used to form a ternary tree. Ternary adder tree 1300 includes three multiplier-adder logical blocks 1301, each of which includes four binary multipliers 1311 and a quaternary adder 1302 formed from three binary adders 1312.

Each logical block 1301 may be formed from two direct-connected physical DSP blocks 1401, as shown in FIG. 14, which represents one implementation 1400 of tree 1300 with only two out of the three logical blocks 1301 depicted. Each physical block 1401 includes two binary multipliers 1411, 1421 and two binary adders 1412, 1422, with multiplexers 1501-1504 allowing multiplier 1421 to output to either of adders 1412, 1422 and the other multiplier 1411 to output only to adder 1412. Internal connection 1505 allows the two adders 1412, 1422 to be cascaded. A direct-connect input 1506 allows a direct input from another block 1401, while a direct-connect output 1516 allows a direct output to another block 1401, both without having to resort to the slower general-purpose interconnect structure of the device of which blocks 1401 are a part.

Internal connection 1505 and direct connection 1506/ 1516 allow three binary adders (two adders 1412, 1422 in one block 1401 and one adder 1412 in another block 1401, as shown in FIG. 14) to form a quaternary adder 1500. Because of the direct connection, the two interconnected blocks 1401 can operate as a single block without the speed limitations of the clock speed of the device of which blocks 1401 are a part, which would be the case if they were interconnected only by the general-purpose programmable interconnect of the device. Thus, the operations in those blocks can occur in many fewer clock cycles of the device than if the operation were conducted in separate blocks interconnected by the general-purpose programmable interconnect.

The next level of ternary adder tree 1300 is connected to the first level by the general-purpose programmable interconnect. As in the case of ternary adder tree 1200, ternary adder 1304 on the next level of ternary adder tree 1300 can be implemented using the two binary adders 102 of an adder block 800. Alternatively, as shown in FIG. 14, ternary adder 1304 can be formed from the two adders 1412, 1422 in a single block 1401, using the two inputs 1512 to adder 1412 and input 1522 to adder 1422, as well as internal connection 1505.

By providing specialized processing blocks, including dedicated but configurable floating point operators, the present invention allows the implementation of certain operations, such as the vector dot product described above, with less reliance on programmable logic outside the blocks. Moreover, as noted above, operations can proceed more quickly because within the individual specialized processing blocks, as well as interconnected specialized processing blocks, operations can occur more quickly than in general-purpose logic or even in specialized processing blocks that are connected using only the general-purpose interconnect.

Instructions for carrying out a method according to this invention for programming a programmable device may be encoded on a machine-readable medium, to be executed by a suitable computer or similar device to implement the method of the invention for programming or configuring PLDs or other programmable devices. For example, a personal computer may be equipped with an interface to which a PLD can be connected, and the personal computer can be used by a user to program the PLD using suitable software tools.

Figure 16:
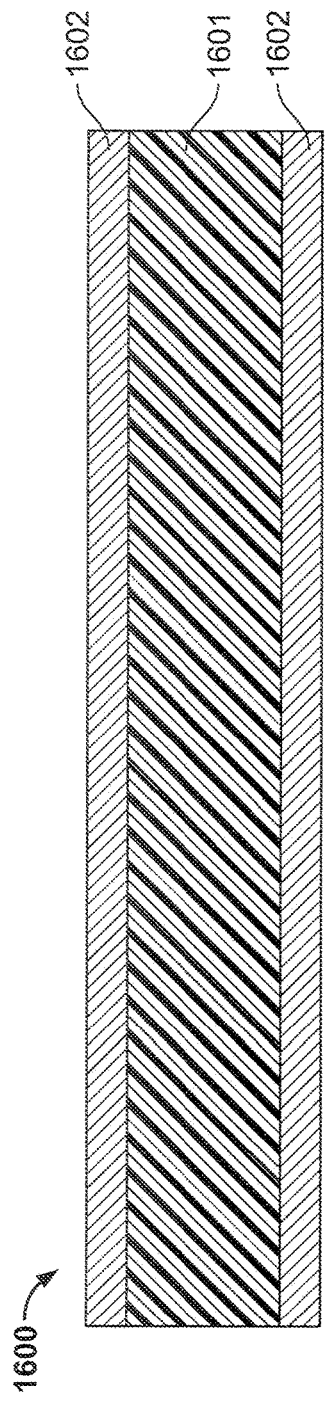
FIG. 16 is a cross-sectional view of a magnetic data storage medium encoded with a set of machine-executable instructions for performing a method according to the present invention.

FIG. 16 presents a cross section of a magnetic data storage medium 1600 which can be encoded with a machine executable program that can be carried out by systems such as the aforementioned personal computer, or other computer or similar device, or encoded with a library of virtual fabrics. Medium 1600 can be a floppy diskette or hard disk, or magnetic tape, having a suitable substrate 1601, which may be conventional, and a suitable coating 1602, which may be conventional, on one or both sides, containing magnetic domains (not visible) whose polarity or orientation can be altered magnetically. Except in the case where it is magnetic tape, medium 1600 may also have an opening (not shown) for receiving the spindle of a disk drive or other data storage device.

The magnetic domains of coating 1602 of medium 1600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 17:
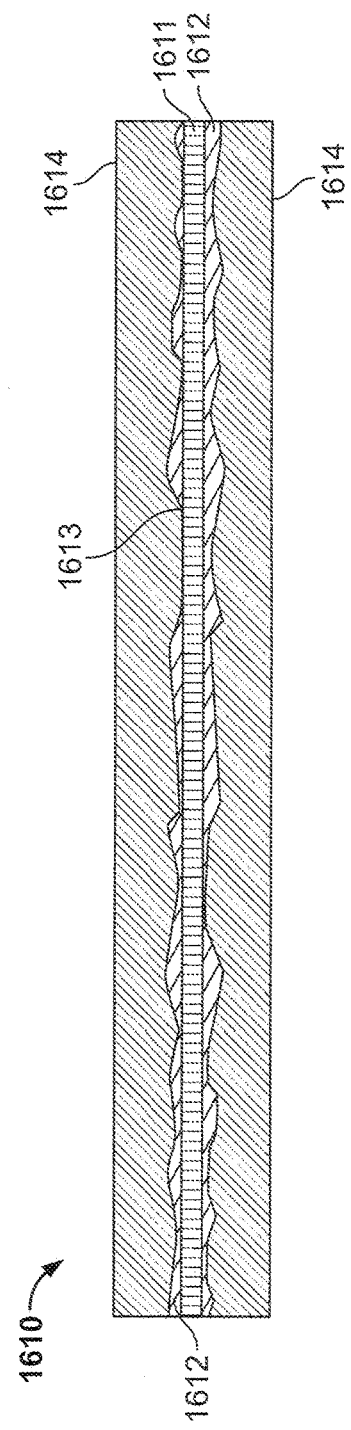
FIG. 17 is a cross-sectional view of an optically readable data storage medium encoded with a set of machine-executable instructions for performing a method according to the present invention.

FIG. 17 shows a cross section of an optically-readable data storage medium 1610 which also can be encoded with such a machine-executable program, which can be carried out by systems such as the aforementioned personal computer, or other computer or similar device, or encoded with a library of virtual fabrics. Medium 1610 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1610 preferably has a suitable substrate 1611, which may be conventional, and a suitable coating 1612, which may be conventional, usually on one or both sides of substrate 1611.

In the case of a CD-based or DVD-based medium, as is well known, coating 1612 is reflective and is impressed with a plurality of pits 1613, arranged on one or more layers, to encode the machine-executable program. The arrangement of pits is read by reflecting laser light off the surface of coating 1612. A protective coating 1614, which preferably is substantially transparent, is provided on top of coating 1612.

In the case of a magneto-optical disk, as is well known, coating 1612 has no pits 1613, but has a plurality of magnetic domains whose polarity or orientation can be changed magnetically when heated above a certain temperature, as by a laser (not shown). The orientation of the domains can be read by measuring the polarization of laser light reflected from coating 1612. The arrangement of the domains encodes the program as described above.

Figure 18:
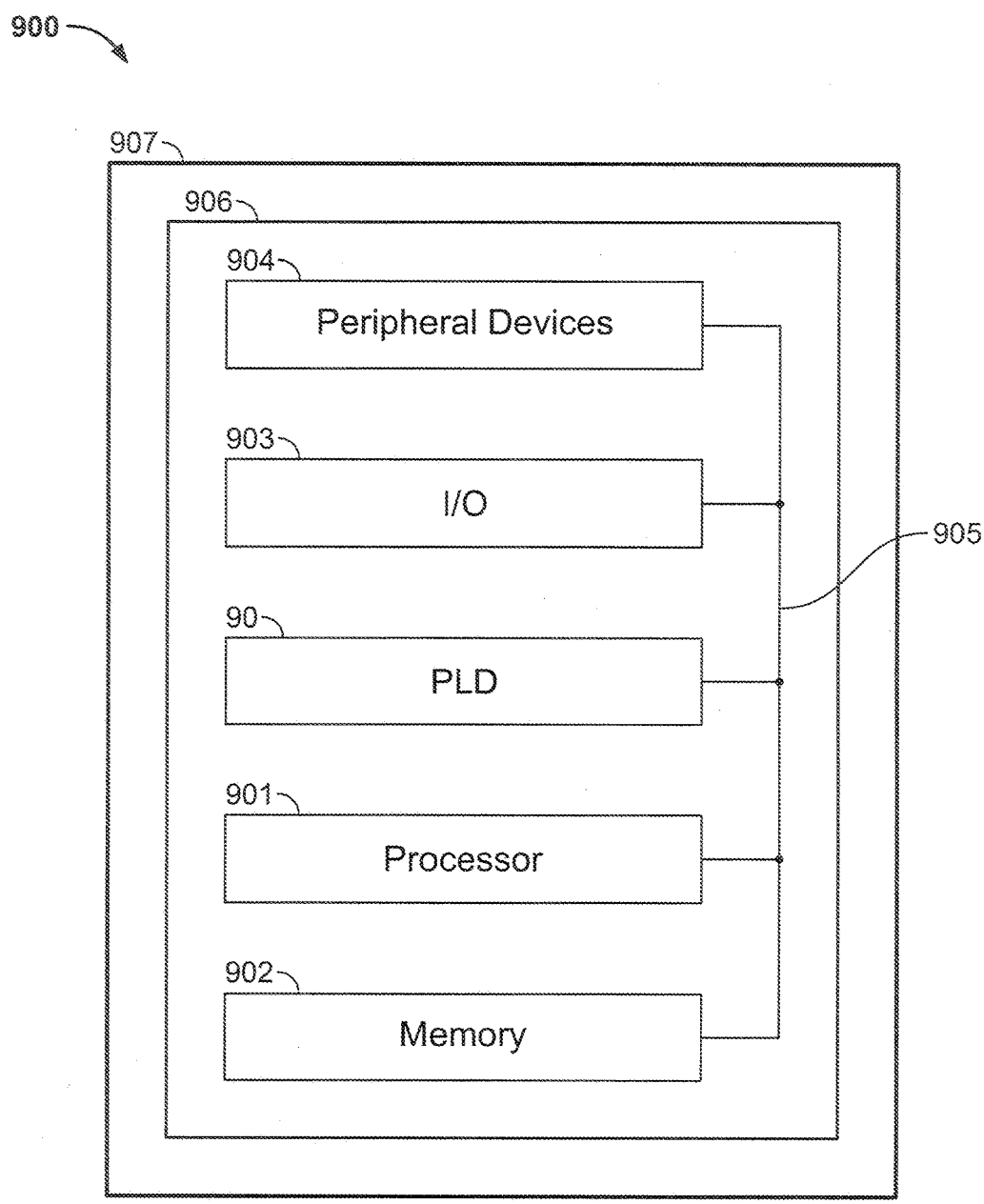
FIG. 18 is a simplified block diagram of an exemplary system employing a programmable logic device incorporating the present invention.

A PLD 90 incorporating specialized processing blocks according to the present invention may be used in many kinds of electronic devices. One possible use is in an exemplary data processing system 900 shown in FIG. 18. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. First, second, and third specialized processing blocks on a programmable integrated circuit device, each of said first, second and third specialized processing blocks comprising:
   a floating-point arithmetic operator stage;
   a floating-point adder stage comprising at least one floating-point binary adder;
   a plurality of block inputs;
   at least one block output;
   a direct-connect input; and
   configurable interconnect that comprises selectable routing connections at least between said direct-connect input and said floating-point adder stage, a first block input of said plurality of block inputs and said floating-point adder stage, a second block input of said plurality of block inputs and said floating-point arithmetic operator stage, said floating-point arithmetic operator stage and said direct-connect output, and said floating-point adder stage and said at least one block output;
   whereby:
   said direct-connect input of said first specialized processing block is coupled to said direct-connect output of said second specialized processing block;
   said direct-connect output of said first specialized processing block is coupled to said direct-connect input of said third specialized processing block; and
   said first, second, and third specialized processing blocks are together configurable to form at least a portion of a recursive adder tree.

2. The first, second, and third specialized processing blocks of claim 1, wherein said configurable interconnect further comprises:
   an internal feedback bus from said at least one block output to said first block input of said plurality of block inputs.

3. The first, second, and third specialized processing blocks of claim 2 wherein:
   said floating-point adder stage includes only one floating-point binary adder; and
   said at least a portion of said recursive adder tree is at least a portion of a binary recursive adder tree.

4. The first, second, and third specialized processing blocks of claim 3 wherein said configurable interconnect further comprises:
   a bypass path from said first block input of said plurality of block inputs to said direct-connect output, wherein an output signal of said floating-point adder stage is routed via said internal feedback bus to said first block input of said plurality of block inputs and from said first block input of said plurality of block inputs via said bypass path to said direct-connect output.

5. The first, second, and third specialized processing blocks of claim 1 wherein:
   said floating-point adder stage includes only one floating-point binary adder; and
   said at least a portion of said recursive adder tree is at least a portion of a ternary recursive adder tree.

6. The first, second, and third specialized processing blocks of claim 1 wherein:
   said floating-point adder stage includes two floating-point binary adders; and
   said at least a portion of said recursive adder tree is at least a portion of a ternary recursive adder tree.

7. The first, second, and third specialized processing blocks of claim 6 wherein:
   said configurable interconnect further comprises an additional selectable routing connection between said two floating-point binary adders that is configurable to route an output of one of said two floating-point binary adders to an input of another of said two floating-point binary adders; and
   said two floating-point binary adders form a ternary adder.

8. A programmable integrated circuit device comprising:
   a plurality of specialized processing blocks, each of said plurality of specialized processing blocks comprising:
   a floating-point arithmetic operator stage;
   a floating-point adder stage comprising at least one floating-point binary adder;
   a plurality of block inputs;
   at least one block output;
   a direct-connect input for connection to a first other specialized processing block of said plurality of specialized processing blocks; and
   a direct-connect output for connection to a second other specialized processing block of said plurality of specialized processing blocks;
   configurable interconnect that comprises selectable routing connections at least between said direct-connect input and said floating-point adder stage, a first block input of said plurality of block inputs and said floating-point adder stage, a second block input of said plurality of block inputs and said first floating-point arithmetic operator stage, said floating-point arithmetic operator stage and said direct-connect output, and said floating-point adder stage and said at least one block output;
   whereby:
   a recursive adder tree is configurable on said programmable integrated circuit device using said plurality of specialized processing blocks.

9. The programmable integrated circuit device of claim 8 wherein:
   said floating-point adder stage includes only one floating-point binary adder; and
   said recursive adder tree configurable on said programmable integrated circuit device is a binary recursive adder tree.

10. The programmable integrated circuit device of claim 9 wherein:
    said binary recursive adder tree is configured using said plurality of specialized processing blocks; and in one of said plurality of specialized processing blocks, said configurable interconnect further comprises a first additional selectable routing connection between said floating-point adder stage and said first block input of said plurality of block inputs of said one of said plurality of specialized processing blocks and a second additional selectable routing connection between said first block input of said plurality of block inputs and said direct-connect output of said one of said plurality of specialized processing blocks.

11. The programmable integrated circuit device of claim 10 further comprising:
general-purpose programmable interconnect outside of said plurality of specialized processing blocks that is coupled at least to said at least one block output of said one of said plurality of specialized processing blocks, wherein a signal is routed from an output of said floating-point adder stage of said one of said plurality of specialized processing blocks via said at least one block output and via said general-purpose programmable interconnect of said programmable integrated circuit device to said first block input of said plurality of block inputs of another one of said plurality of specialized processing blocks.

12. The programmable integrated circuit device of claim 11 wherein said one of said plurality of specialized processing blocks further comprises an internal feedback bus from said at least one block output of said one of said plurality of specialized processing blocks to said first block input of said plurality of block inputs of said one of said plurality of specialized processing blocks.

13. The programmable integrated circuit device of claim 8 wherein:
said floating-point adder stage includes only one floating-point binary adder; and
said recursive adder tree configurable on said programmable integrated circuit device is a ternary recursive adder tree.

14. The programmable integrated circuit device of claim 8 wherein:
said floating-point adder stage includes two floating-point binary adders; and
said recursive adder tree configurable on said programmable integrated circuit device is a ternary recursive adder tree.

15. The programmable integrated circuit device of claim 14 wherein:
said configurable interconnect further comprises an additional selectable routing connection between said two floating-point binary adders that is configurable to route an output of one of said two floating-point binary adders to an input of another of said two floating-point binary adders; and
said two floating-point binary adders form a ternary adder.

16. The programmable integrated circuit device of claim 14 wherein:
said configurable interconnect further comprises a first additional selectable routing connection between said two floating-point binary adders that is configurable to route an output of one of said two floating-point binary adders to an input of another of said two floating-point binary adders, and a second additional selectable routing connection between said one of said two floating-point binary adders and said direct-connect output that is configurable to route an output of one of said two floating-point binary adders to said direct-connect output; and said two floating-point binary adders in one of said plurality of specialized processing blocks and one of said floating-point adders in another of said plurality of specialized processing blocks form a quaternary adder.

17. A method of configuring a programmable integrated circuit device as a recursive adder tree, said programmable integrated circuit device comprising specialized processing blocks, each of said specialized processing blocks including:
a floating-point arithmetic operator stage,
a floating-point adder stage comprising at least one floating-point binary adder,
a plurality of block inputs,
at least one block output,
a direct-connect input for connection to a first other specialized processing block of said specialized processing blocks,
a direct-connect output for connection to a second other specialized processing block of said specialized processing blocks, and
configurable interconnect that comprises selectable routing connections at least between said direct-connect input and said floating-point adder stage, said floating-point adder stage and a first block input of said plurality of block inputs, a second block input of said plurality of block inputs and said floating-point arithmetic operator stage, said first block input of said plurality of block inputs and said direct-connect output, and said floating-point adder stage and said at least one block output;
said method comprising:
configuring a binary recursive adder tree using said specialized processing blocks; wherein:
in one of said specialized processing blocks, an output of said floating-point adder stage is fed back via said configurable interconnect to said first block input of said plurality of block inputs of said one of said specialized processing blocks and routed from said first block input of said plurality of block inputs via said configurable interconnect to said direct-connect output of said one of said specialized processing blocks.

18. The method of claim 17, wherein said programmable integrated circuit device further comprises general-purpose programmable interconnect outside of said specialized processing blocks that is coupled at least to said at least one block output of said one of said specialized processing blocks, the method further comprising:
feeding back said output of said floating-point adder stage of said one of said specialized processing blocks via said at least one block output of said one of said specialized processing blocks and said general-purpose programmable interconnect of said programmable integrated circuit device to said input of said one of said specialized processing blocks.

19. The method of claim 17 wherein:
said floating-point adder stage includes two floating-point binary adders and said configurable interconnect further comprises an additional selectable routing connection between said two floating-point binary adders that is configurable to route an output of one of said two floating-point binary adders to an input of another of said two floating-point binary adders; said method comprising:
routing said output of said one of said two floating-point binary adders to said input of said another of said two floating-point binary adders to form a ternary adder.

20. The method of claim 17 wherein in each of said specialized processing blocks:

said floating-point adder stage includes two floating-point binary adders and said configurable interconnect further comprises:
  a first additional selectable routing connection between said two floating-point binary adders that is configurable to route one output of one of said two floating-point binary adders to an input of another of said two floating-point binary adders, and
  a second additional selectable routing connection between said one of said two floating-point binary adders and said direct-connect output that is configurable to route another output of said one of said two floating-point binary adders to said direct-connect output; said method comprising:
routing said one output of said one of said two floating-point binary adders in said one of said specialized processing blocks to said input of said another of said two floating-point binary adders in said one of said specialized processing blocks;
routing said another output of said one of said two floating-point binary adders in another of said specialized processing blocks to said direct-connect output of said another of said specialized processing blocks;
routing said direct-connect output of said another of said specialized processing blocks to said direct-connect input of said one of said specialized processing blocks; and
routing said direct-connect input of said one of said specialized processing blocks to said input of said another of said two floating-point binary adders in said one of said specialized processing blocks; thereby:
forming a quaternary adder from said one of said two floating-point binary adders and said another of said two floating-point binary adders in said one of said specialized processing blocks and said one of said two floating-point binary adders in said another of said specialized processing blocks.

21. A non-transitory machine-readable data storage medium encoded with machine-executable instructions for performing a method of configuring a programmable integrated circuit device as a recursive adder tree, said programmable integrated circuit device comprising specialized processing blocks, each of said specialized processing blocks including:
a floating-point arithmetic operator stage,
a floating-point adder stage comprising at least one floating-point binary adder,
a plurality of block inputs,
at least one block output,
a direct-connect input for connection to a first other specialized processing block of said specialized processing blocks,
a direct-connect output for connection to a second other specialized processing block of said specialized processing blocks, and
configurable interconnect that comprises selectable routing connections at least between said direct-connect input and said floating-point adder stage, said floating-point adder stage and a first block input of said plurality of block inputs, a second block input of said plurality of block inputs and said floating-point arithmetic operator stage, said first block input of said plurality of block inputs and said direct-connect output, and said floating-point adder stage and said at least one block output;
said instructions comprising:
instructions to configure a binary recursive adder tree using said specialized processing blocks; wherein:
  in one of said specialized processing blocks, an output of said floating-point adder stage is fed back via said configurable interconnect to said first block input of said plurality of block inputs of said one of said specialized processing blocks and routed via said configurable interconnect to said direct-connect output of said one of said specialized processing blocks.

22. The non-transitory machine-readable data storage medium of claim 21, wherein said programmable integrated circuit device further comprises general-purpose programmable interconnect outside of said specialized processing blocks that is coupled at least to said at least one block output of said one of said specialized processing blocks, wherein said instructions comprise instructions to feed back said output of said floating-point adder stage of said one of said specialized processing blocks via said at least one block output of said one of said specialized processing blocks and said general-purpose programmable interconnect of said programmable integrated circuit device to said first block input of said plurality of block inputs of said one of said specialized processing blocks.

23. The non-transitory machine-readable data storage medium of claim 21 wherein:
said floating-point adder stage includes two floating-point binary adders and said configurable interconnect further comprises an additional selectable routing connection between said two floating-point binary adders that is configurable to route an output of one of said two floating-point binary adders to an input of another of said two floating-point binary adders; said instructions comprising:
instructions to route said output of said one of said two floating-point binary adders to said input of said another of said two floating-point binary adders to form a ternary adder.

24. The non-transitory machine-readable data storage medium of claim 21 wherein:
said floating-point adder stage includes two floating-point binary adders and said configurable interconnect further comprises:
  a first additional selectable routing connection between said two floating-point binary adders that is configurable to route an output of one of said two floating-point binary adders to an input of another of said two floating-point binary adders, and
  a second additional selectable routing connection between said one of said two floating-point binary adders and said direct-connect output that is configurable to route another output of said one of said two floating-point binary adders to said direct-connect output; said instructions comprising:
instructions to route said output of said one of said two floating-point binary adders in said one of said specialized processing blocks to said input of said another of said two floating-point binary adders in said one of said specialized processing blocks;
instructions to route said output of said one of said two floating-point binary adders in another of said specialized processing blocks to said direct-connect output of said another of said specialized processing blocks;
instructions to route said direct-connect output of said another of said specialized processing blocks to said direct-connect input of said one of said specialized processing blocks; and
instructions to route said direct-connect input of said one of said specialized processing blocks to another input of said another of said two floating-point binary adders in said one of said specialized processing blocks; thereby:

forming a quaternary adder from said one of said two floating-point binary adders and said another of said two floating-point binary adders in said one of said specialized processing blocks and said one of said two floating-point binary adders in said another of said specialized processing blocks.

* * * * *